(12) United States Patent
O'Brien et al.

(10) Patent No.: US 11,227,644 B2
(45) Date of Patent: Jan. 18, 2022

(54) SELF-ALIGNED SPIN ORBIT TORQUE (SOT) MEMORY DEVICES AND THEIR METHODS OF FABRICATION

(71) Applicant: Intel Corporation, Santa Clara, CA (US)

(72) Inventors: Kevin O'Brien, Portland, OR (US); Noriyuki Sato, Hillsboro, OR (US); Kaan Oguz, Portland, OR (US); Mark Doczy, Beaverton, OR (US); Charles Kuo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 738 days.

(21) Appl. No.: 15/942,086

(22) Filed: Mar. 30, 2018

(65) Prior Publication Data

US 2019/0304523 A1    Oct. 3, 2019

(51) Int. Cl.
| | |
|---|---|
| *G11C 11/16* | (2006.01) |
| *H01L 43/12* | (2006.01) |
| *H01L 27/22* | (2006.01) |
| *B82Y 25/00* | (2011.01) |

(52) U.S. Cl.
CPC .......... *G11C 11/161* (2013.01); *H01L 27/228* (2013.01); *H01L 43/12* (2013.01); *B82Y 25/00* (2013.01)

(58) Field of Classification Search
CPC ..... G11C 11/161; H01L 43/12; H01L 27/228; H01L 43/02; H01L 43/08; B82Y 25/00; H01F 41/307; H01F 10/329
See application file for complete search history.

(56) References Cited

U.S. PATENT DOCUMENTS

| 2019/0165256 A1* | 5/2019 | Tien ............... H01L 23/5226 |
| 2019/0259808 A1* | 8/2019 | Jacob ............. H01L 27/228 |

* cited by examiner

*Primary Examiner* — Karen Kusumakar
*Assistant Examiner* — Adam S Bowen
(74) *Attorney, Agent, or Firm* — Essential Patents Group, LLP

(57) ABSTRACT

A spin orbit torque (SOT) memory device includes a MTJ device on a SOT electrode, where a first portion of the SOT electrode extends beyond a sidewall of the MTJ by a first length that is no greater than a height of the MTJ, and where a second portion of the first electrode extends from the sidewall and under the MTJ by a second length that is no greater than a width of the MTJ. The MTJ device includes a free magnet, a fixed magnet and a tunnel barrier between the free magnet and the fixed magnet.

19 Claims, 14 Drawing Sheets

100

```
┌─────────────────────────────────────────────────────────────────┐
│  Forming a conductive interconnect in a dielectric above a substrate │
│                              110                                 │
└─────────────────────────────────────────────────────────────────┘
                                │
                                ▼
┌─────────────────────────────────────────────────────────────────┐
│   Form a spin orbit torque electrode layer on the conductive interconnect │
│                              120                                 │
└─────────────────────────────────────────────────────────────────┘
                                │
                                ▼
┌─────────────────────────────────────────────────────────────────┐
│ Form a material layer stack for a magnetic tunnel junction (MTJ) device on the │
│                 spin orbit torque electrode layer                │
│                              130                                 │
└─────────────────────────────────────────────────────────────────┘
                                │
                                ▼
┌─────────────────────────────────────────────────────────────────┐
│         Pattern the material layer stack and form an MTJ device  │
│                              140                                 │
└─────────────────────────────────────────────────────────────────┘
                                │
                                ▼
┌─────────────────────────────────────────────────────────────────┐
│ Perform asymmetric ion beam etch using MTJ device to shadow directional etch │
│                 of spin orbit torque electrode layer             │
│                              150                                 │
└─────────────────────────────────────────────────────────────────┘
```

FIG. 1

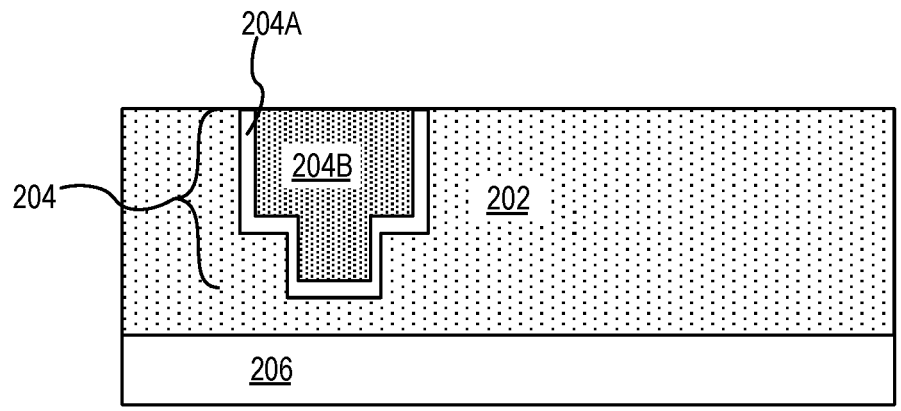
FIG. 4
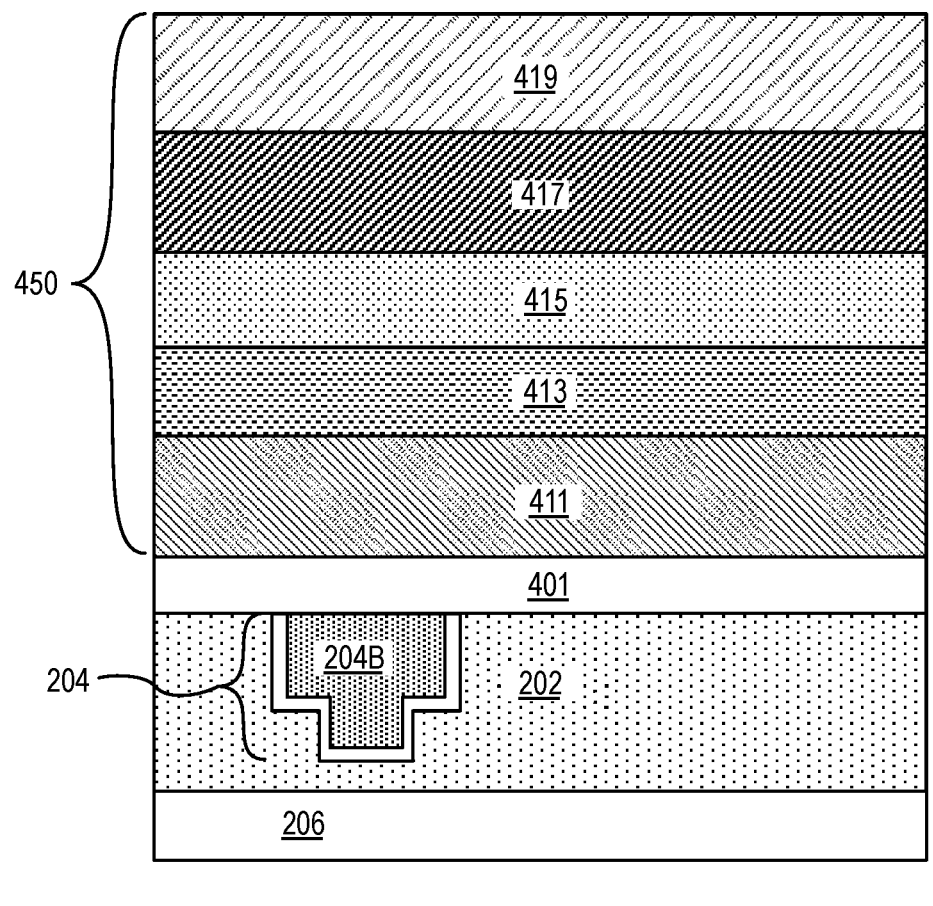
FIG. 5

US 11,227,644 B2

SELF-ALIGNED SPIN ORBIT TORQUE (SOT) MEMORY DEVICES AND THEIR METHODS OF FABRICATION

BACKGROUND

For the past several decades, the scaling of features in integrated circuits has been a driving force behind an ever-growing semiconductor industry. Scaling to smaller and smaller features enables increased densities of functional units on limited real estate of semiconductor chips. For example, shrinking transistor size allows for an incorporation of an increased number of memory devices on a chip, lending to fabrication of products with increased functionality. The drive for ever-more functionality, however, is not without issue. It has become increasingly significant to rely on innovative devices such as spin orbit torque (SOT) memory devices including a spin orbit torque electrode coupled with a compatible MTJ device to overcome the requirements imposed by scaling.

Non-volatile embedded memory with SOT memory devices, e.g., on-chip embedded memory with non-volatility can enable energy and computational efficiency. However, the technical challenges of assembling a material layer stack to form functional SOT memory devices present formidable roadblocks to commercialization of this technology today. Specifically, creating self-aligned SOT devices that overcome alignment issues between scaled magnetic tunnel junction devices and scaled spin orbit torque electrodes are some important aspects of device development.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1 illustrates an outline of a method to fabricate a self-aligned SOT memory device.

FIG. 4 illustrates a conductive interconnect surrounded by a dielectric layer formed above a substrate.

FIG. 5 illustrates a cross-sectional view of FIG. 4 following the formation of a spin orbit torque layer on a dielectric layer followed by the formation of a MTJ material layer stack.

DESCRIPTION OF THE EMBODIMENTS

Figure 2A:
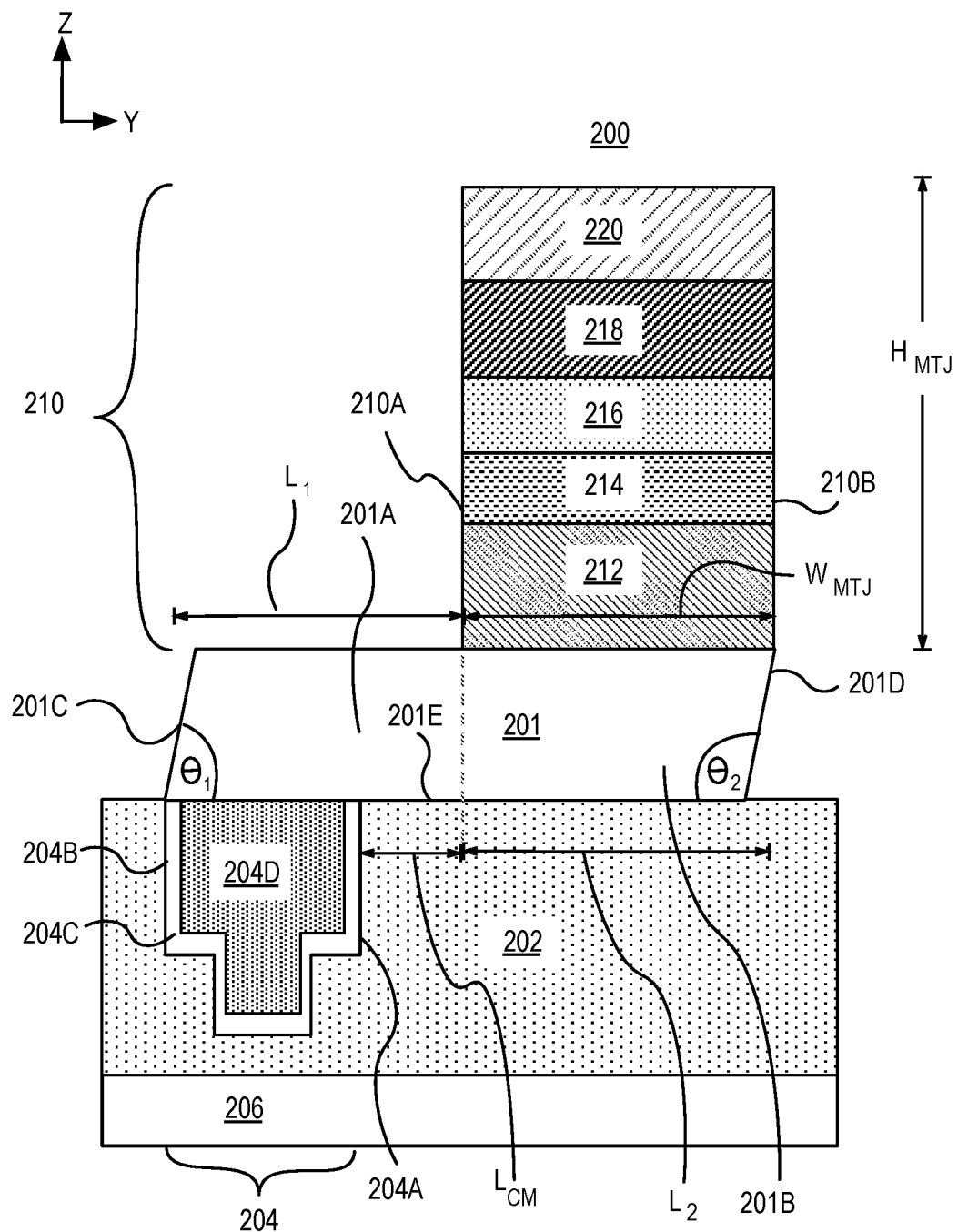
FIG. 2A is an illustration of a cross-sectional view of a SOT memory device.

Self-aligned spin orbit torque (SOT) memory devices and their methods of fabrication are described. In the following description, numerous specific details are set forth, such as novel structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with magnetic memory devices, are described in lesser detail in order to not unnecessarily obscure embodiments of the present disclosure. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following descriptions, numerous details are set forth. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

A SOT memory device may include a magnetic tunnel junction (MTJ) device formed on an electrode including a spin orbit torque material (herein referred to as a spin orbit torque electrode). The MTJ device functions as a memory device where the resistance of the MTJ device switches between a high resistance state and a low resistance state. The resistance state of an MTJ device is defined by the relative orientation of magnetization between a free magnet and a fixed magnet that are separated by a tunnel barrier. When the magnetization of the free magnet and a fixed magnet have orientations that are in the same direction, the MTJ device is said to be in a low resistance state. Conversely, when the magnetization of the free magnet and a fixed magnet each have orientations that are in opposite direction to each other, the MTJ device is said to be in a high resistance state.

Resistance switching in an MTJ device is brought about by passing a critical amount of spin polarized current through the MTJ device so as to influence the orientation of the magnetization of the free magnet to align with the magnetization of the fixed magnet. The act of influencing the magnetization is brought about by a phenomenon known as spin torque transfer, where the torque from the spin polarized current is imparted to the magnetization of the free magnet. By changing the direction of the current, the direction of magnetization in the free magnet may be reversed relative to the direction of magnetization in the fixed magnet. Since the free magnet does not need a constant source of spin polarized current to maintain a magnetization direction, the resistance state of the MTJ device is retained even when there is no current flowing through the MTJ device. For this reason, the MTJ device belongs to a class of memory known as non-volatile memory.

As MTJ devices are scaled, the need for smaller memory elements to fit into a scaled cell size has driven the industry in the direction of perpendicular MTJ (pMTJ). pMTJ based memory devices have a fixed magnetic layer and a free magnetic layer each having a magnetic anisotropy that is perpendicular with respect to a plane defining an uppermost surface of the spin orbit torque electrode.

As a MTJ device is further scaled down in size, the amount of critical spin polarized current density required to switch the device increases. It then becomes advantageous to have an additional source of switching torque to avoid simply increasing the spin polarized current density. By implementing an MTJ device on a spin orbit torque electrode, the magnetization in the free magnetic layer gets an additional switching torque from a second source. The additional torque comes from a Spin Hall current, induced by passing an electrical current in a transverse direction, through the spin orbit torque electrode. The spin hall current arises from spin dependent scattering of electrons due to a phenomenon known as spin orbit interaction. Electrons of one spin polarity are directed towards an upper portion of the spin orbit torque electrode and electrons with an opposite spin polarity are directed toward a bottom portion of the spin orbit torque electrode. Depending on the direction of an applied current, electrons of a particular spin polarity are directed toward the MTJ device and impart a spin orbit torque on the magnetization of the free magnetic layer. By providing switching assistance in the form of a spin orbit torque, the spin hall current may help the MTJ device to switch faster. It is to be appreciated that, in an embodiment, the spin hall current can fully switch a free magnetic layer having a magnetization that is oriented in an in-plane direction, even in the absence of a spin polarized current passing through the MTJ device. An in-plane direction is defined as a direction that is parallel to an uppermost surface of the spin orbit torque electrode. To switch a free magnetic layer having a perpendicular magnetization, an external magnetic field may be implemented to aid with magnetization reversal.

An implementation where an MTJ is coupled with an SOT electrode may result in a three terminal SOT memory device, where two terminals are connected to at opposite ends of the SOT electrode to induce the Spin Hall current. One end of an MTJ stack is coupled to the SOT electrode between these two terminals, and another end of the MTJ stack is further coupled to a third terminal. The MTJ may be biased with respect to one of the two SOT electrode terminals to provide a spin transfer torque current. An MTJ may also be coupled with a SOT electrode to form a two terminal SOT memory device. In such an instance, a first of the two terminals may be coupled to the SOT electrode, and a second of the two terminals may be coupled to the MTJ. However, as SOT memory devices are scaled, alignment between the SOT electrode and MTJ can become challenging and self-aligning an MTJ material stack to an SOT electrode highly desirable.

In some embodiments, the spin diffusion current and the spin transfer torque current are generated virtually concurrently in the two-terminal SOT memory device. A self-aligned two terminal SOT memory device may advantageously provide device size scalability advantages, such as, reduced SOT electrode length compared to a regular three terminal SOT memory device. For example, the density of SOT memory devices per unit area may be increased by a factor of at least 2-fold over a 3 terminal SOT memory device. A self-aligned two terminal SOT memory device may provide further advantages such as reduced number of lithography operations, and may maintain a constant ratio between an SOT electrode width and an MTJ memory device width independent of the size of the MTJ device. A self-aligned 2 terminal SOT memory device may be fabricated by a technique where an MTJ device is first patterned over a SOT electrode layer, and then used to asymmetrically shadow a directional etch of the SOT electrode layer with no additional lithographic operations.

As MTJ devices (formed on spin orbit torque electrode) are scaled, the need for smaller memory elements to fit into a scaled cell size has driven the industry in the direction of perpendicular MTJs. Perpendicular MTJs are memory devices where the fixed magnetic layer and the free magnetic layer have magnetic anisotropy that is perpendicular with respect to a plane defining an uppermost surface of the spin orbit torque electrode. By implementing a perpendicular MTJ on a spin orbit torque electrode several advantages can be gained such as increased thermal stability and switching torque assistance from a spin hall current.

Specific embodiments are described herein with respect to a SOT memory device including a MTJ device. It is to be appreciated that embodiments described herein may be applicable to in-plane MTJ devices including in-plane spin torque transfer memory (STTM) devices, as well as perpendicular MTJ devices including perpendicular spin torque transfer memory (pSTTM) devices.

FIG. 1 illustrates an outline of a method to fabricate a self-aligned SOT memory device. The method 100 begins at operation 110 by forming a conductive interconnect in a dielectric layer above a substrate. In some embodiments, the conductive interconnect is formed in a dielectric layer by any damascene or a dual damascene process known in the art. The method continues in operation 120 with the deposition of a SOT electrode layer on the conductive interconnect and on the dielectric layer. The SOT electrode layer may blanket deposited, for example. The method 100 continues at operation 130 with the formation of a MTJ material layer stack on the SOT electrode layer. In exemplary embodiments, the MTJ material layer stack is blanket deposited in-situ without breaking vacuum after deposition of the SOT electrode layer. In a simplest embodiment, forming the MTJ material layer stack includes deposition of a free magnet layer on the SOT electrode layer, deposition of a tunnel barrier layer deposited on the free magnet layer, and deposition of a fixed magnet layer on the tunnel barrier layer. Forming the MTJ material layer may also include the deposition of a synthetic antiferromagnetic structure on the fixed magnetic layer. A top electrode layer may be further deposited to complete the MTJ material layer stack.

The method 100 is continued at operation 140 with patterning of the MTJ material layer stack to form a MTJ device. In some embodiments, the MTJ device is formed by etching the material layer stack until stopping on the underlying SOT electrode layer. The method 100 is then resumed at operation 150 where an asymmetrical etch of the SOT electrode layer is performed using an angled ion beam etching process. This angled etch is masked by the MTJ device. The ion beam milling process may include directing an ion beam (e.g., of a noble gas such as argon) towards the SOT electrode layer at an angle non-normal to plane of the SOT electrode layer. If the workpiece is not rotated during the angled etch process by an amount sufficient to eliminate the non-normal etch bias, the MTJ device asymmetrically masks, or shadows, portions of the SOT electrode layer as the ion beam removes the portions that are not shadowed by the MTJ device. When a SOT electrode layer is patterned in this manner, a SOT electrode that is formed has a first portion that is under the MTJ and aligned with the MTJ, and a second portion that is not covered by the MTJ device but was within a solid angle shadow projection of the MTJ device during the angled etch process. The size and shape of the second portion is therefore a function of a height of the MTJ device, shape of the MTJ device, and the angle(s) at which the ion beam is directed during the etching of SOT electrode layer. In some embodiments, the ion beam is directed at an angle between 45 to 80 degrees away from vertical. In some embodiments, a large number of MTJ devices are patterned over an SOT electrode layer to form high density memory array and the angled etch forms a large collection of SOT electrodes where each electrode has a portion under the MTJ and a portion uncovered by each MTJ device that was shadowed.

FIG. 2A is an illustration of a cross-sectional view of a SOT memory device 200 in accordance with an embodiment of the present disclosure. The SOT memory device 200 includes a first electrode 201 having a SOT material (herein referred to as a SOT electrode 201). The SOT memory device 200 further includes a magnetic tunnel junction (MTJ) device 210 on the electrode 201, where the MTJ device 210 has a height, $H_{MTJ}$, and a width, $W_{MTJ}$. In the illustrative embodiment, a portion 201A of the SOT electrode 201 extends beyond a sidewall 210A of the MTJ device 210 by a first length, $L_1$. The SOT electrode portion 201A has dimensions that are a function of a shadow projected by MTJ device 210 during an angled etch of SOT electrode 201. In exemplary embodiments, the SOT electrode portion 201A extends beyond the sidewall 210A of the MTJ device 210 by a first length, $L_1$, that is no greater than the height, $H_{MTJ}$, of the MTJ device 210. A portion 201B of the SOT electrode 201 extends from the sidewall 210A and under the MTJ by a second length, $L_2$, that is no greater than the width, $W_{MTJ}$, of the MTJ device 210. The SOT electrode portion 201B has dimensions that are a function of a direct masking by MTJ device 210 during an angled etch of SOT electrode 201.

The MTJ device 210 includes a free magnet 212 coupled with the SOT electrode 201, a fixed magnet 216 above the free magnet 212, a tunnel barrier 214 between the free magnet 212 and the fixed magnet 216, and a second electrode 220 coupled with the fixed magnet 216. In an embodiment, the MTJ device 210 further includes a synthetic antiferromagnetic (SAF) structure between the electrode 220 and the fixed magnet 216.

As illustrated, the SOT electrode portion 201A has a sidewall 210C having a first slope and the SOT electrode portion 201B has a sidewall 210D having a second slope. In the illustrative embodiment, the first slope and the second slope are different from a slope of the sidewall 210A of the MTJ device 210. The slope of sidewall 210A may, for example, be more orthogonal to a plane of SOT electrode 201 than is the slope of the sidewall 201C and/or sidewall 201D. The sidewall 201C has a slope, $\theta_1$, where $\theta_1$ is measured relative to a lowermost surface 201E of the SOT electrode 201, as illustrated in FIG. 2A. In some embodiments, the sidewall has a slope, $\theta_1$, between 45 degrees and 80 degrees. The sidewall 201D has a slope, $\theta_2$, where $\theta_2$ is measured relative to the lowermost surface 201E of the SOT electrode 201, also as illustrated in FIG. 2A. In some embodiments, the sidewall 201D has a slope, $\theta_2$, between 100 and 135 degrees. In some embodiments, such as is illustrated in FIG. 2A, the sidewall 201C and sidewall 201D are substantially parallel. In some such embodiments, $\theta_1$, and $\theta_2$ are supplementary angles.

In some embodiments, the SOT electrode portion 201A may advantageously extend beyond the sidewall 210A of the MTJ device 210 by a first length, $L_1$, that is no greater than the height, $H_{MTJ}$, of the MTJ device 210. The length, $L_1$, may extend beyond the sidewall 210A by an amount between 15% and 100% of the height, $H_{MTJ}$, of the MTJ device 210. In some examples length, $L_1$, may extend beyond the sidewall 210A by an amount substantially equal to the height, $H_{MTJ}$. Depending on the embodiment, the MTJ device 210, $H_{MTJ}$ has a range between 20 nm and 100 nm. The MTJ device 210 has a width that ranges between 20 nm and 100 nm. The SOT portion 201B has a width that is substantially between 20 nm and 100 nm.

In an embodiment, the SOT electrode 201 is in contact with a conductive interconnect 204. In some embodiments, the conductive interconnect 204 has a sidewall 204A that is laterally spaced apart from the sidewall 210A of the MTJ device 210 by an amount, $L_{CM}$ that is less than the length, $L_1$, of the SOT electrode portion 201A. In the illustrated example, the conductive interconnect 204 is in contact with the SOT electrode portion 201A, and the sidewall 204A is distant from the sidewall 210A of the MTJ device 210 by an amount $L_{CM}$ that is less than the length, $L_1$, of the SOT electrode portion 201A. The conductive interconnect 204 has a sidewall 204B opposite to the sidewall 204A.

Depending on the distance, $L_{CM}$, between sidewall 204A and sidewall 210A of the MTJ device 210, and a width of the conductive interconnect 204, portions of the conductive interconnect 204 may be fully or partially covered by the SOT electrode portion 201A. In some such embodiments, a sidewall 204B of the conductive interconnect 204 that is opposite to the sidewall 204A, may be wholly within (not illustrated). the SOT electrode portion 201A or be laterally extend away (not illustrated). from the sidewall 201C.

In some embodiments, the conductive interconnect 204 has a portion that is in contact with the SOT electrode portion 201B. In some such embodiments, the sidewall 204A extends under the MTJ device 210. The sidewall 204A may under the MTJ device 210 by an amount between 2 nm and 5 nm. As illustrated, the conductive interconnect 204 is adjacent to a dielectric layer 202 above a substrate 206.

Figure 2B:
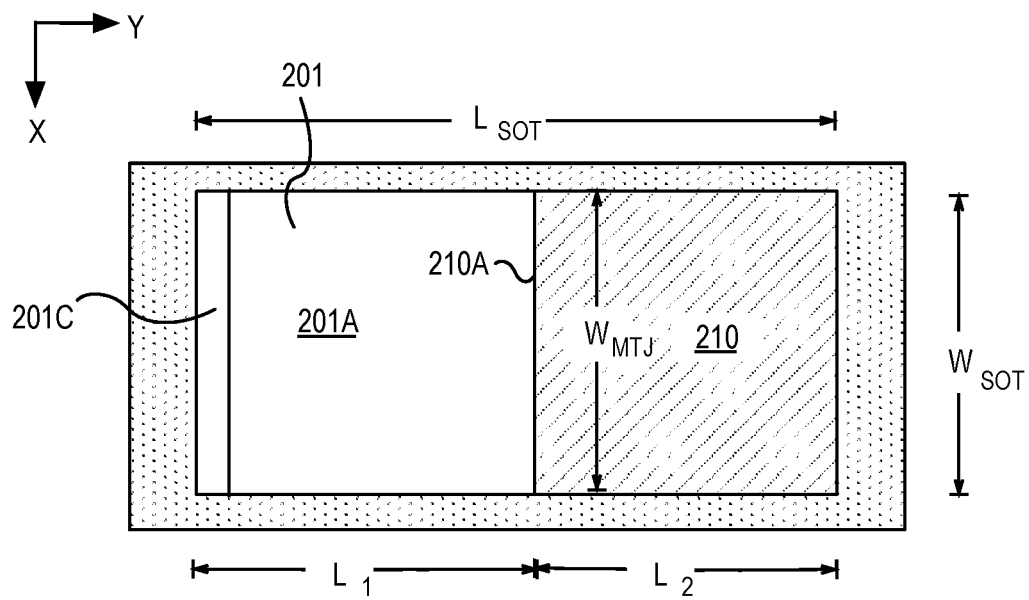
FIG. 2B illustrates a plan view of the SOT memory device.

FIG. 2B illustrates a plan view of the SOT memory device 200. In the illustrative embodiment, MTJ device 210 has a substantially square plan view profile. MTJ device 210 may also have other plan view profile shapes such as rectangular, elliptical or circular. In an embodiment, when an MTJ memory device is an in-plane MTJ device, the in-plane MTJ device has a plan view profile that is elliptical. In embodiments where a MTJ memory device is a pMTJ device, the pMTJ device has a plan view profile that is elliptical, square or circular.

As illustrated, the SOT electrode 201 has a width, $W_{SOT}$, (along the X-axis) that is substantially similar to a width, $W_{MTJ-X}$, (along the X-axis) of the MTJ device 210. In some embodiments, the MTJ device 210 has a width $W_{MTJ-X}$, that is between 20 nm and 100 nm and the SOT electrode 201 has a width, $W_{SOT}$, between 20 nm and 100 nm. The SOT electrode 201 has a length, $L_{SOT}$, that is a sum of the combined lengths, $L_1$ and $L_2$ of the SOT electrode portions 201A and 201B, respectively. In some embodiments, the SOT electrode 201 has a length, $L_{SOT}$, between 40 nm and 200 nm.

Figure 2C:
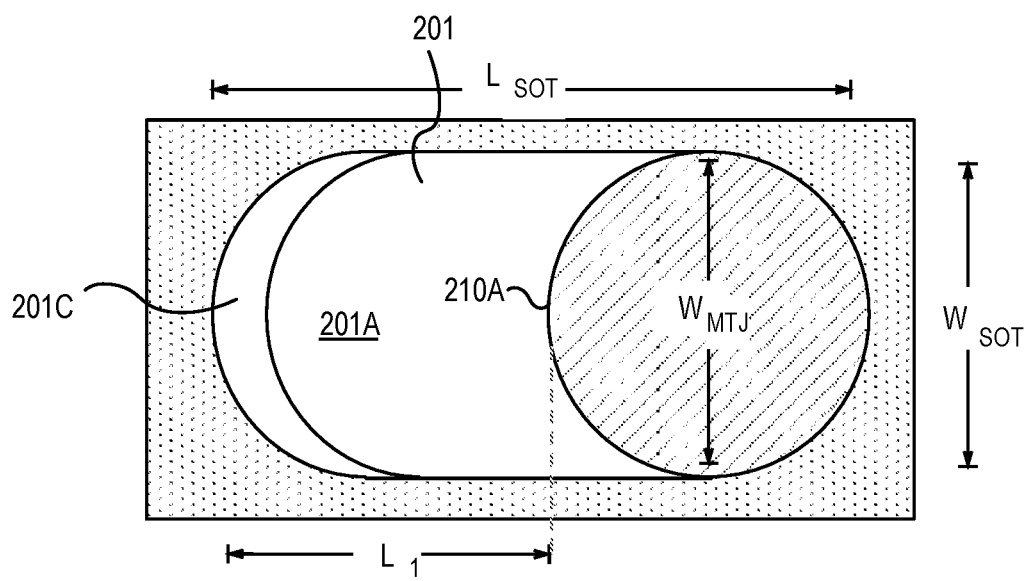
FIG. 2C illustrates a plan view of the SOT memory device.

It is to be appreciated that the sidewall 201C, of the SOT electrode portion 201A, has an edge profile from a plan view perspective that is substantially similar to a plan view edge profile of the sidewall 210A of the MTJ device 210. In the illustrated example, the sidewall 210A is a substantially straight line from a plan perspective, and the sidewall 201C is also a substantially straight line from a plan perspective. In an embodiment, when the MTJ device 210 has a circular shape, such as is illustrated in FIG. 2C, the sidewall 201A of the SOT electrode portion 201A has shape that substantially matches an arc of the sidewall 210A of the MTJ device 210. In other embodiments, a sidewall 201C may have an increased amount of curvature compared to the sidewall 210A illustrated in FIG. 2C (and will be discussed further below).

Referring again to FIG. 2A, the SOT electrode 201 includes a metal with high degree of spin orbit coupling. A metal with a high degree of spin-orbit coupling has an ability to inject a large spin polarized current in to the free magnet 212. A large spin polarized current may exert a large amount of torque and influence the magnetization of the free magnet 212 to switch faster.

In an embodiment, the SOT electrode 201 includes a metal such as, but not limited to, tantalum, tungsten, platinum or gadolinium. In an embodiment, SOT electrode 201 includes a beta phase tantalum or beta phase tungsten. A SOT electrode 201 including a beta phase tantalum or beta phase tungsten may have a higher spin hall efficiency than a SOT electrode including platinum. A high spin hall efficiency denotes that the SOT electrode 201 can generate a large spin hall current for a given charge current that is passed through the SOT electrode 201. In an embodiment, the SOT electrode 201 has thickness of between 5 nm and 20 nm.

In an embodiment, the free magnet 212 includes a magnetic material such as Co, Ni, Fe or alloys of these materials. In an embodiment, the free magnet 212 includes a magnetic material such as CoB, FeB, CoFe or CoFeB. In some embodiments, the free magnet 212 includes a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the free magnet 212 is FeB, where the concentration of boron is between 10 and 40 atomic percent of the total composition of the FeB alloy. In an embodiment, the free magnet 212, for applications in an in-plane MTJ device, has a thickness between 2.0 nm and 3.0 nm. In an embodiment, the free magnet 212, for applications in a pMTJ device 210, has a thickness between 0.9 nm and 2.0 nm.

In an embodiment, tunnel barrier 214 is composed of a material suitable for allowing electron current having a majority spin to pass through tunnel barrier 214, while impeding, at least to some extent, electron current having a minority spin from passing through tunnel barrier 214. Thus, tunnel barrier 214 (or spin filter layer) may also be referred to as a tunneling layer for electron current of a particular spin orientation. In an embodiment, tunnel barrier 308 includes a material such as, but not limited to, magnesium oxide (comprising predominantly magnesium and oxygen) or aluminum oxide (comprising predominantly aluminum and oxygen). In an embodiment, tunnel barrier 214 including MgO has a crystal orientation that is (001) and is lattice matched to free magnet 212 below tunnel barrier 214 and fixed magnet 216 above tunnel barrier 214. In an embodiment, tunnel barrier 214 is MgO and has a thickness in the range of 1 nm to 2 nm. In an embodiment, a free magnet 212 including a $Co_{100-x-y}Fe_xB_y$, is highly lattice matched to the tunnel barrier 214 including an MgO. Lattice matching a crystal structure of the free magnet 212 with the tunnel barrier 214 enables a higher tunneling magnetoresistance (TMR) ratio in the MTJ device 210.

In some embodiments, the fixed magnet 216 includes a material and has a thickness sufficient for maintaining a fixed magnetization. In an embodiment, the fixed magnet 216 of the MTJ device 210 includes an alloy such as CoFe or CoFeB. In an embodiment, the fixed magnet 216 comprises a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the fixed magnet 216 is FeB, where the concentration of boron is between 10 and 40 atomic percent of the total composition of the FeB alloy. In an embodiment the fixed magnet 216, for applications in a pMTJ device 210, has a thickness that is between 1 nm and 3 nm.

In an embodiment, the conductive interconnect 204 includes a barrier layer 204A, such as tantalum nitride, and a fill metal 204B, such as copper, tungsten or ruthenium. In an embodiment, the dielectric layer 202 includes a material such as, but not limited to, silicon dioxide, silicon nitride, silicon carbide, or carbon doped silicon oxide. The dielectric layer 202 may have an uppermost surface that is substantially co-planar with an uppermost surface of the conductive interconnect 204, as illustrated.

Figure 2D:
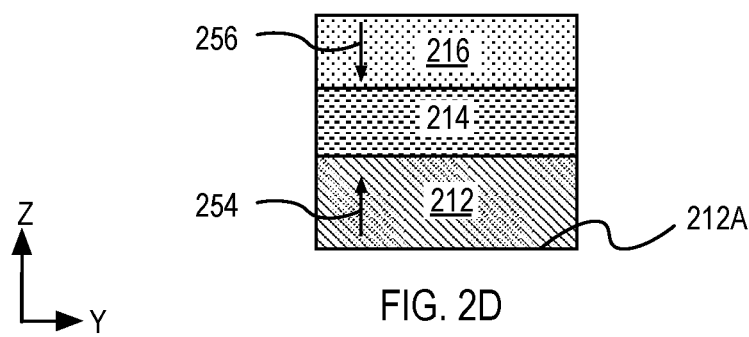
FIG. 2D illustrates a cross-sectional view depicting a direction of magnetization in a free magnet that is anti-parallel to a direction of magnetization in a fixed magnet, in accordance with an embodiment of the present disclosure.

FIG. 2D illustrates a cross-sectional view depicting the free magnet 212 of a pMTJ device 210 having a direction of magnetization (denoted by the direction of the arrow 254) that is perpendicular to a horizontal surface 212A of the free magnet 212. In the illustrative embodiment, the magnetization 254 is anti-parallel to a direction of magnetization (denoted by the direction of the arrow 256) in the fixed magnet 216. When the magnetization 254 in the free magnet 212 is directed opposite (anti-parallel) to the magnetization 256 in the fixed magnet 216, the pMTJ device 210 device is said to be in a high resistance state.

Figure 2E:
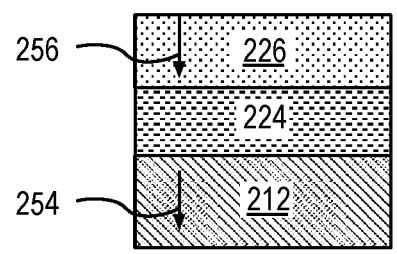
FIG. 2E illustrates a cross-sectional view depicting a direction of magnetization in a free magnet that is parallel to a direction of magnetization in a fixed magnet, in accordance with an embodiment of the present disclosure.

Conversely, FIG. 2E illustrates a cross-sectional view depicting the free magnet 212 of the pMTJ device 210 having a magnetization 254 that is parallel to a direction of magnetization 256 in the fixed magnet 216. When the magnetization 254 in the free magnet 212 is directed parallel to the magnetization 256 in the fixed magnet 216, the pMTJ device 210 is said to be in a low resistance state.

In some embodiments, when the free magnet 212 and the fixed magnet 216 have approximately similar thicknesses, an injected spin polarized current, which changes the direction of the magnetization 254 in the free magnet 212, can also affect the magnetization 256 of the fixed magnet 216. In some such embodiments, a fixed magnet 216 having a higher magnetic anisotropy than the free magnet 212 can make the fixed magnet 216 more resistant to accidental flipping. Magnetic anisotropy of the fixed magnet 216 may also be increased by coupling the fixed magnet 216 with a synthetic antiferromagnetic (SAF) structure 218. In an embodiment, the MTJ device 210 includes a SAF structure 218 between the electrode 220 and the fixed magnet 216 to help prevent accidental flipping of magnetization in the fixed magnet 216 as illustrated in FIG. 1A.

Figure 2F:
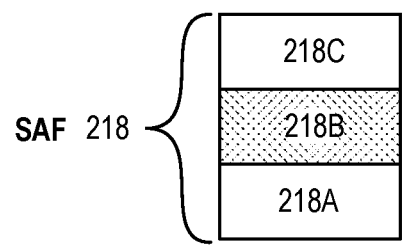
FIG. 2F illustrates a cross-sectional view of individual layers of a synthetic antiferromagnetic structure, in accordance with an embodiment of the present disclosure.

FIG. 2F illustrates cross-sectional view of the SAF structure 218 in an accordance of an embodiment of the present invention. In an embodiment, the SAF structure 218 includes a non-magnetic layer 218B sandwiched between a pinning ferromagnet 218A and a pinning ferromagnet 218C as depicted in FIG. 2D. The pinning ferromagnet 218A and the pinning ferromagnet 218C are anti-ferromagnetically coupled to each other. In an embodiment, the pinning ferromagnet 218A includes a layer of a magnetic metal such as Co, Ni, Fe, alloys such as CoFe, CoFeB, or alloys of magnetic metals such as Co, Ni, Fe or a bilayer of a magnetic/non-magnetic metals such but not limited to Co/Pd or a Co/Pt. In an embodiment, the non-magnetic layer 218B includes a ruthenium or an iridium layer. In an embodiment, the pinning ferromagnet 218C includes a layer of a magnetic metal such as Co, Ni, Fe, alloys such as CoFe, CoFeB, or alloys of magnetic metals such as Co, Ni, Fe or a bilayer of a magnetic/non-magnetic metals such but not limited to Co/Pd or a Co/Pt. In an embodiment, a ruthenium based non-magnetic layer 218B has a thickness between 0.3 and 1.0 nm to advantageously enable anti-ferromagnetic coupling between the pinning ferromagnet 218A and the pinning ferromagnet 218C.

It is to be appreciated that additional layers may be present within an MTJ device. For example, a non-magnetic spacer layer may exist between the fixed magnet 216 and the SAF structure 218 (not illustrated in FIG. 1A). A non-magnetic spacer layer, may for example, enable coupling between the SAF structure 218 and the fixed magnet 216. In an embodiment, a non-magnetic spacer layer may include a metal such as Ta, Ru or Ir.

Referring again to FIG. 2A, the MTJ device 210 further includes an electrode 220 on the SAF structure 218. In an embodiment, the electrode 220 includes a material such as Ta or TiN. In an embodiment, the electrode 220 has a thickness between 5 nm and 70 nm.

In an embodiment, the substrate 206 includes a suitable semiconductor material such as but not limited to, single crystal silicon, polycrystalline silicon and silicon on insulator (SOI). In another embodiment, substrate 206 includes other semiconductor materials such as germanium, silicon germanium or a suitable group III-N or a group III-V compound. Substrate 206 may include logic devices such as MOSFET transistors and access transistors. Logic devices such as access transistors may be integrated with memory devices such as SOT memory devices to form embedded memory. Embedded memory including SOT memory devices and logic MOSFET transistors can be combined to form functional integrated circuit such as a system on chip.

Figure 3A:
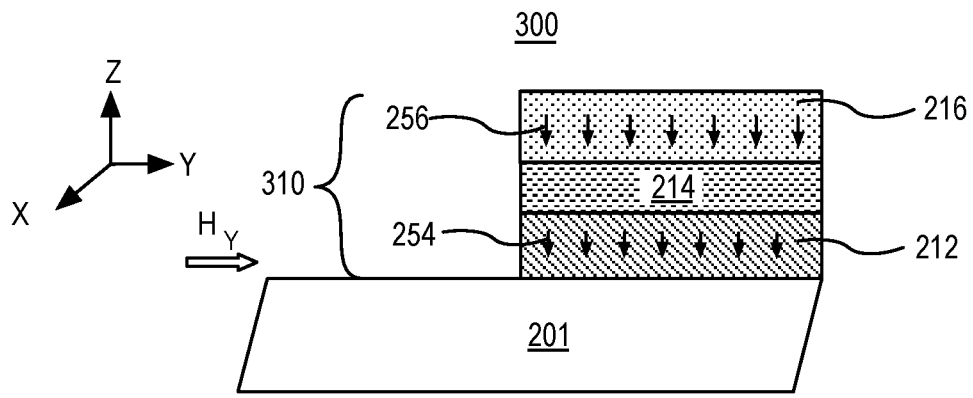
FIG. 3A illustrates a pSOT memory device where a magnetization of a free magnet is aligned in a direction parallel to a magnetization of the fixed magnet.
Figure 3B:
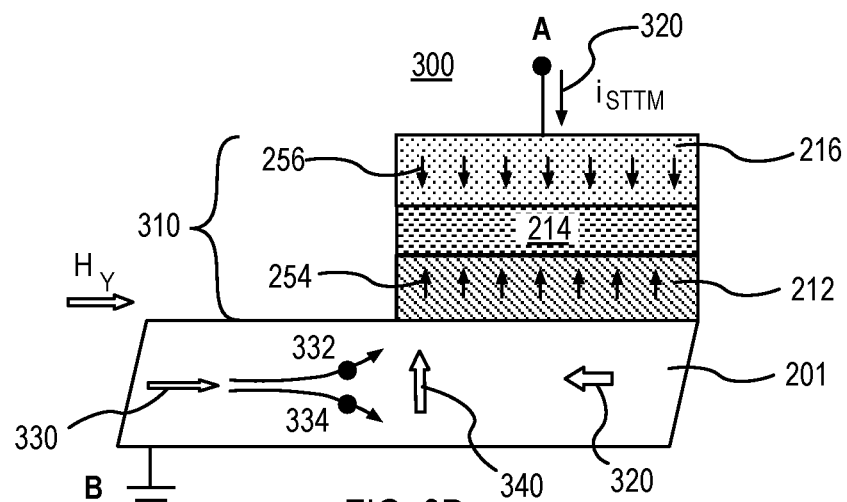
FIG. 3B illustrates the pMTJ device of the spin orbit torque (SOT) memory device switched to a high resistance state.
Figure 3C:
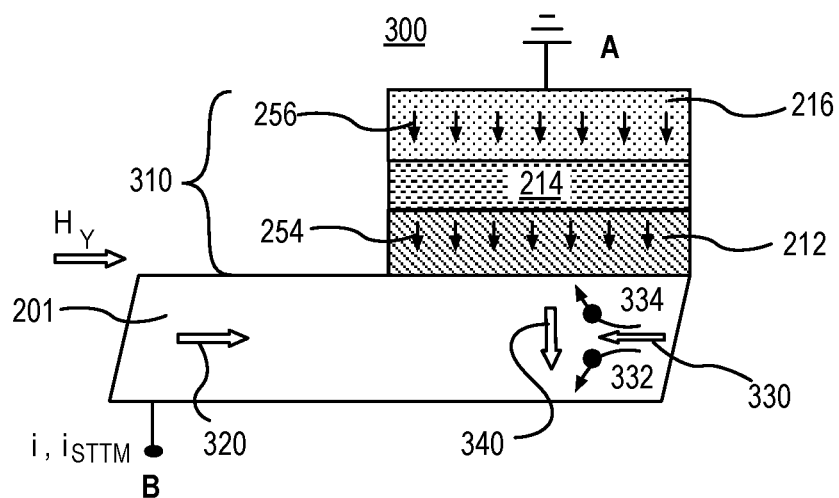
FIG. 3C illustrates a pMTJ device of the spin orbit torque (SOT) memory device switched to a low resistance state.

FIGS. 3A-3C illustrate a mechanism for switching a spin orbit torque (SOT) memory device such as a spin orbit torque (SOT) memory device 300 including an MTJ device 310 on the SOT electrode 201. In the illustrative embodiment, the MTJ device 310 is a pMTJ device 310 where the pMTJ device includes some of the features of the MTJ device 210, such as the free magnet 212, the fixed magnet 216 and the tunnel barrier 214 between the free magnet 212, the fixed magnet 216, where the free magnet 212 and the fixed magnet 216 have perpendicular anisotropy.

FIG. 3A illustrates a pSOT memory device 300 including the pMTJ device 310 on the SOT electrode 201, where a magnetization 254 of the free magnet 212 is aligned in a direction parallel to the magnetization 256 of the fixed magnet 216. In an embodiment, the direction of magnetization 254 of the free magnet 212 and the direction of magnetization 256 of the fixed magnet 216 are both in the negative Z-direction, as illustrated in FIG. 3A. As discussed above, when the magnetization 254 of the free magnet 212 is in a direction parallel to a direction of magnetization 256 of the fixed magnet 216, MTJ device 210 is in a low resistance state FIG. 3B illustrates the pMTJ device 310 of the spin orbit torque (SOT) memory device 300 switched to a high resistance state. In an embodiment, a reversal in the direction of magnetization 254 of the free magnet 212 in FIG. 3B relative to the direction of magnetization 254 of the free magnet 212 in FIG. 3A is brought about by (a) driving a sufficient spin transfer torque (STTM) current ($i_{STTM}$) 330 in the pMTJ 310, and by (b) inducing a spin diffusion current 340 in the spin orbit torque electrode 201, in the Z-direction. In an embodiment, magnetization reversal can also be aided by applying an external magnetic field, $H_Y$, in the Y direction. In other embodiments, an in-plane exchange bias at an interface between a ferromagnetic-free magnet 212 and an antiferromagnetic SOT electrode 201 can aid with magnetization reversal instead of an externally applied magnetic field $H_Y$.

In an embodiment, the current 320 passes through the pMTJ device in the negative Z-direction (by applying a positive voltage at terminal A with respect to a grounded terminal B) and through the SOT electrode 201 (in the negative Y direction). In response to the current 320, an electron current 330 flows in a positive Y-direction. The electron current 330, which include electrons with two opposite spin orientations experience spin dependent scattering in the spin orbit torque electrode 201. Spin dependent scattering causes electrons with a spin angular moment 332 (in the negative X-direction) to be deflected upwards towards an uppermost portion of the spin orbit torque electrode 201 and electrons with a spin angular moment 334 (directed in the positive x direction) to be deflected downwards towards a lowermost portion of the spin orbit torque electrode 201. The separation between the electrons with the spin angular moment 332 and the electrons with the spin angular moment 334 induces a spin diffusion current 340 in the spin orbit torque electrode 201. The spin diffusion current 340 is directed upwards toward the free magnet 212 of the pMTJ device 310. The spin diffusion current 340 induces a spin hall torque on the magnetization 254 of the free magnet 212 causing the magnetization to change from the negative Z-direction depicted in FIG. 3A, to an intermediate magnetization state (in the negative X-direction). In an embodiment, the current 320, flowing through the MTJ device 210 exerts a torque on the magnetization 254 of the free magnet 212. In some such embodiment, the presence of an external magnetic field provides a symmetry breaking field like torque to assist flipping the magnetization 254. The combination of spin hall torque, spin transfer torque and torque from the external magnetic field, $H_Y$, causes flipping of magnetization 254 in the free magnet 212 from the intermediate magnetization state (negative X-direction) to a positive Z-direction illustrated in FIG. 3B.

FIG. 3C illustrates the pMTJ device 310 of the spin orbit torque (SOT) memory device 300 switched to a low resistance state. In an embodiment, a reversal in the direction of magnetization 254 of the free magnet 212 in FIG. 3C compared to the direction of magnetization 254 of the free magnet 212 in FIG. 3B is brought about by (a) reversing the direction of spin transfer torque (STTM) current ($i_{STTM}$) 320 in the pMTJ 310, and by (b) reversing the direction of the spin diffusion current 340 in the SOT electrode 201, inducing a spin diffusion current 340 in the spin orbit torque electrode 201, in the negative Z-direction. In an embodiment, magnetization reversal can also be aided by applying an external magnetic field, $H_Y$, in the Y direction. In one embodiment, the direction of current is reversed by applying a positive voltage at terminal B with respect to a grounded terminal A.

In some examples, an in-plane exchange bias at an interface between the free magnet 212 and the SOT electrode 201 can provide a similar effect as the externally applied magnetic field $H_Y$ and replace the external applied magnetic field $H_Y$.

FIG. 4-FIG. 8B illustrate cross-sectional views representing various operations in a method of fabricating a SOT memory device, such as the SOT memory device 200 in accordance with embodiments of the present disclosure.

FIG. 4 illustrates a conductive interconnect 204 surrounded by a dielectric layer 202 formed above a substrate 206. In some embodiments, the conductive interconnect 204 is formed in a dielectric layer 202 by a damascene or a dual damascene process, such as any known in the art. In an embodiment, the conductive interconnect 204 includes a barrier layer 204A, such as tantalum nitride, and a fill metal 204B, such as copper, tungsten or ruthenium. In an embodiment, the conductive interconnect 204 is fabricated using a subtractive etch process when materials other than copper are utilized. In an embodiment, the dielectric layer 202 includes a material such as but not limited to silicon dioxide, silicon nitride, silicon carbide, or carbon doped silicon oxide. The dielectric layer 202 may have an uppermost surface that is substantially co-planar with an uppermost surface of the conductive interconnect 204, as illustrated. In some examples, the dielectric layer 202 has a total thickness between 70 nm and 300 nm. In some embodiments, conductive interconnect 204 is electrically connected to a circuit element such as a transistor (not shown)

FIG. 5 illustrates a cross-sectional view of FIG. 4 following the formation of a spin orbit torque (SOT) layer 401 on a dielectric layer 404 formed above a substrate 406 followed by the formation of a material layer stack 450 to form a MTJ device (herein referred to as MTJ material layer stack 450). In an embodiment, the SOT layer 401 is a material that is substantially similar to the material of the spin orbit torque spin orbit torque electrode 201. In an embodiment, the SOT layer 401 includes a metal such as Pt, beta-tungsten and beta-tantalum. In an embodiment, the SOT layer 401 is deposited using a physical vapor deposition (PVD) process or a plasma enhanced chemical vapor deposition (PECVD) process. In an embodiment, the spin orbit torque SOT layer 401 has a thickness that is between 5 nm and 20 nm.

In some embodiments, forming the MTJ material layer stack 450 includes blanket depositing a free magnetic layer 411 on the SOT layer 401. The free magnetic layer 411 layer may be deposited using a PVD process. In an embodiment, the free magnetic layer 411 includes a material that is the same or substantially the same as the material of the free magnet 212. In an exemplary embodiment, the free magnetic layer 411 is $Co_{100-x-y}Fe_xB_y$, where X and Y each represent atomic percent, further where X is between 50 and 80 and Y is between 10 and 40, and further where the sum of X and Y is less than 100. In some embodiments, the deposition process includes the formation of a free magnetic layer 411 that is amorphous. The free magnetic layer 411 may deposited to a thickness between 0.9 nm and 2.0 nm to fabricate a perpendicular MTJ device.

The process continues with deposition of a tunnel barrier layer 413. In some embodiments, the tunnel barrier layer 413 is blanket deposited on the free magnetic layer 411. In an embodiment, the tunnel barrier layer 413 includes a material such as MgO or $Al_2O_3$. In an exemplary embodiment, the tunnel barrier layer 413 is an MgO and is deposited using a reactive sputter process. In an embodiment, the reactive sputter process is carried out at room temperature. In an embodiment, the tunnel barrier layer 413 is deposited to a thickness between 0.8 nm and 1 nm. In an embodiment, the deposition process is carried out in a manner that yields a tunnel barrier layer 413 having an amorphous structure. In some examples, the amorphous tunnel barrier layer 413 becomes crystalline after a high temperature anneal process to be described further below. In other embodiments, the tunnel barrier layer 413 is crystalline as deposited.

In an embodiment, the fixed magnetic layer 415 is blanket deposited on an uppermost surface of the tunnel barrier layer 413. In an embodiment, the deposition process includes a physical vapor deposition (PVD) or a plasma enhanced chemical vapor deposition process. In an embodiment, the PVD deposition process includes an RF or a DC sputtering process. In an exemplary embodiment, the fixed magnetic layer 415 is $Co_{100-x-y}Fe_xB_y$, where X and Y each represent atomic percent, further where X is between 50 and 80 and Y is between 10 and 40, and further where the sum of X and Y is less than 100. In some embodiments, the fixed magnetic layer 415 includes a material that is the same or substantially the same as the material of the fixed magnet 216 described above. In some examples, the fixed magnetic layer 415 may be deposited to a thickness between 2.0 nm and 3.0 nm.

The process is continued with deposition of layers utilized to form a SAF layer 417. In some embodiments, the layers utilized to form SAF layer 417 are blanket deposited on the fixed magnetic layer 417 using a PVD process. The layers utilized to form SAF layer 417 are the same or substantially the same as the layers in the SAF structure 218 described above.

In an embodiment, the deposition process concludes with a blanket deposition of an electrode layer 419 on an uppermost surface of the SAF layer 417. In an embodiment, the electrode layer 419 includes a material that is suitable to act as a hardmask during a subsequent etching of the MTJ material layer stack 450 to form a MTJ device on the SOT layer 401. In an embodiment, the electrode layer 419 includes a material such as TiN, Ta or TaN. In an embodiment, the thickness of the top electrode layer ranges from 5 nm and 70 nm. The thickness of the electrode layer 419 is chosen to accommodate patterning of the MTJ material layer stack 450 to form a MTJ device.

In an embodiment, after all the layers in the MTJ material layer stack 450 are deposited, an anneal is performed. In an embodiment, the anneal process enables formation of a crystalline MgO-tunnel barrier layer 413 to be formed. In an embodiment, the anneal is performed immediately post deposition but before patterning of the MTJ material layer stack 450. A post-deposition anneals of the MTJ material layer stack 450 is carried out in a furnace in a forming gas environment. In an embodiment, the forming gas includes a mixture of $H_2$ and $N_2$ gas. In an embodiment, the anneal temperature ranges between 300 and 350 degrees Celsius.

In an embodiment, the annealing process also promotes solid phase epitaxy of the free magnetic layer 411 to follow a crystalline template of the tunnel barrier layer 413 (e.g., MgO) that is directly above the free magnetic layer 411. In an embodiment, the anneal also promotes solid phase epitaxy of the fixed magnetic layer 415 to follow a crystalline template of the tunnel barrier layer 413 (e.g., MgO) that is directly below the fixed magnetic layer 415. <001> Lattice matching between the tunnel barrier layer 413 and the free magnetic layer 411 and <001> lattice matching between the tunnel barrier layer 413 and the fixed magnetic layer 415 may enable a TMR ratio as high as 110% to be obtained in the MTJ material layer stack 450.

In an embodiment, the annealing process is also performed in the presence of a magnetic field which sets a direction of magnetization of the fixed magnetic layer 415 and in the free magnetic layer 411. In an embodiment, during the annealing process, an applied magnetic field that is directed perpendicular to a plane of the MTJ material layer stack 450 enables a perpendicular anisotropy to be set in the fixed magnetic layer 415 and in the free magnetic layer 411. In an embodiment, the annealing process anti-ferromagnetically aligns the magnetization of the fixed magnetic layer 415 with a magnetization of the SAF layer 417.

Figure 6:
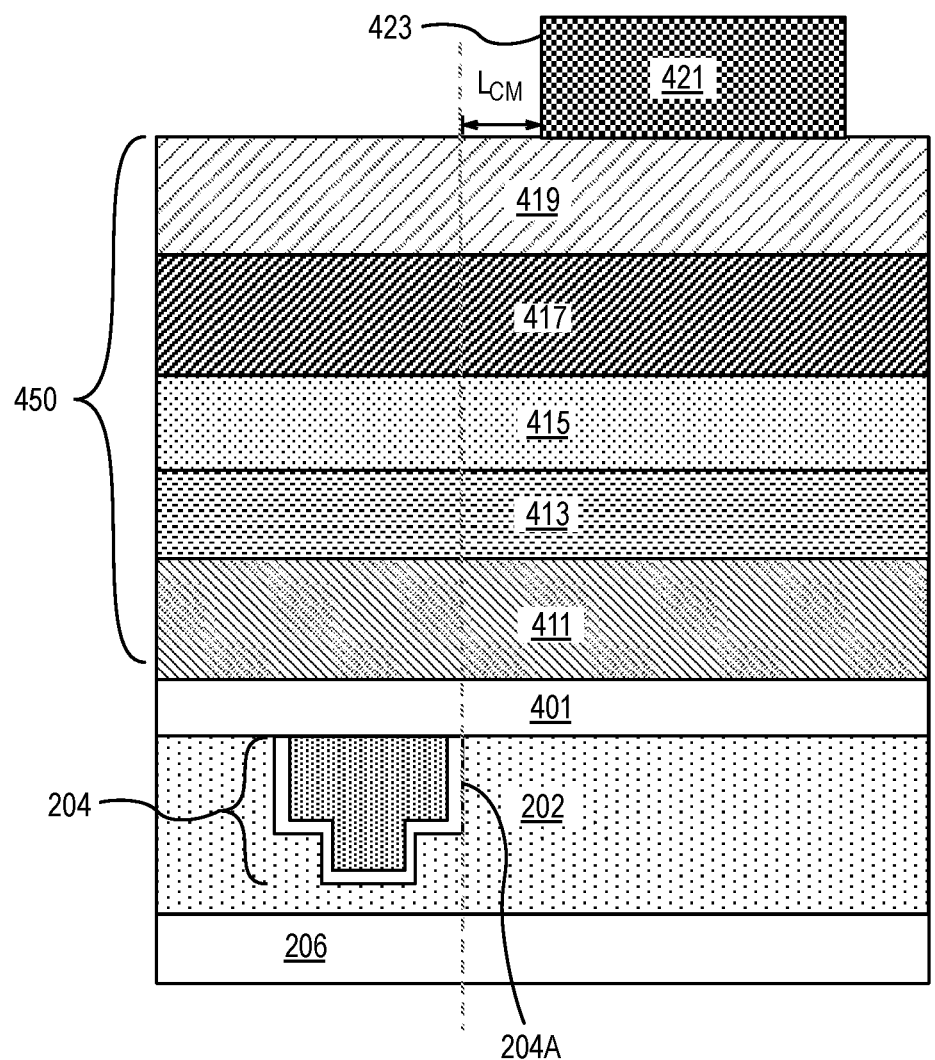
FIG. 6 illustrates a cross-sectional view of the structure in FIG. 5 following the formation of a mask 421 over a MTJ material layer stack.

FIG. 6 illustrates a cross-sectional view of the structure in FIG. 4G following the formation of a mask 421 over the MTJ material layer stack 450. The mask 421 may be formed by any lithographic process known in the art. In other embodiments, the mask 421 includes a dielectric material that has been patterned. In the illustrative embodiment, the mask is formed on a plane above, but laterally apart from the sidewall 204A of the conductive interconnect 204. A sidewall 423 of the mask 421 is laterally spaced apart from the sidewall 204A by a distance $L_{CM}$, as illustrated in FIG. 6. In some embodiments, the sidewall 423 of the mask 421 is laterally spaced apart from the sidewall 204A by a distance $L_{CM}$, that varies between 0 nm and 50 nm. Sidewall 423 of the mask 421 will define a sidewall of a patterned MTJ device.

The mask 421 defines a shape and size of a MTJ device and a location where the MTJ device is to be subsequently formed with respect the spin orbit torque electrode 201. In some embodiments, the mask 421 has a square shape as is depicted in the plan view illustration of FIG. 2B. In other embodiments the mask 421 has a circular shape as is depicted in the plan view illustration of FIG. 2C.

Figure 7A:
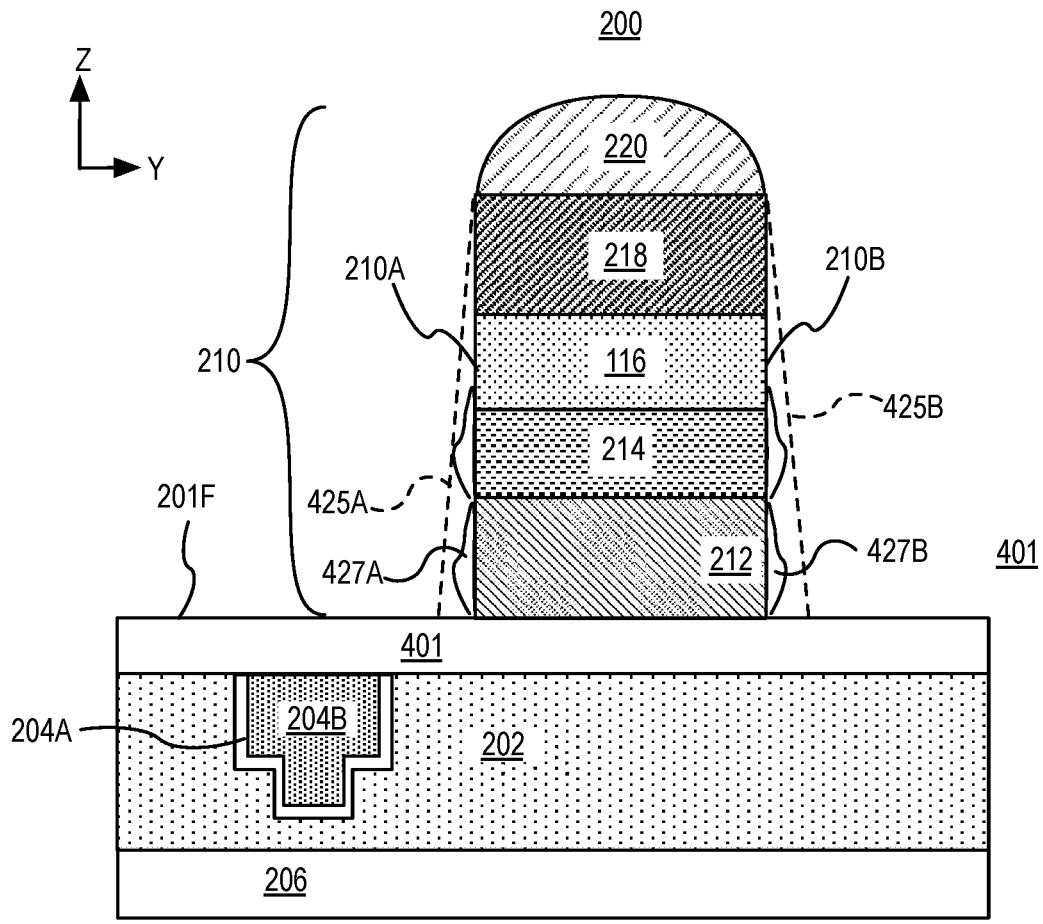
FIG. 7A illustrates a cross-sectional view of the structure in FIG. 6 following patterning and etching of a material layer stack to form a MTJ device.

FIG. 7A illustrates a cross-sectional view of the structure in FIG. 6 following patterning and etching of the MTJ material layer stack 450. In an embodiment, the patterning process first includes etching the electrode layer 419 by an anisotropic plasma etch process to form an electrode 220. In an embodiment, plasma etch process possesses sufficient ion energy and chemical reactivity to render substantially vertical sidewalls of the electrode layer 220.

In an embodiment, the plasma etch process(es) is then continued to pattern the remaining layers of the MTJ material layer stack 450 to form a MTJ device 210. The plasma etch process(es) subsequently etches the various layers in the MTJ material layer stack 450 to form a SAF structure 218, a fixed magnet 216, a tunnel barrier 214, and a free magnet 212. The plasma etch is halted just before completely exposing an uppermost surface 201F of the spin orbit torque electrode 201. In the illustrative embodiment, the MTJ device 210 has sidewalls 210A and 210B that are substantially vertical. In other embodiments, depending on properties of the plasma etchants (energy, reactivity, density etc.), the MTJ device 210 may have sidewalls that are tapered during the etching process, as indicated by the dashed lines 425A and 425B. In some embodiments, the tapering may be further caused by formation of residual byproducts (herein residue 427A, 427B) that remain on sidewalls 210A and 210B during the plasma etching process. In other examples where the sidewall is substantially vertical there may be still be etch residue 427A, and 427B on sidewalls 210A and 210B, respectively as illustrated in FIG. 7A.

A residue cleanup etch process may be utilized to clean up the residue. In some such embodiments, the residue may remain on sidewalls 210 and 210B, even after a residue cleanup etch process. In some embodiments, a thin upper fraction of the SOT electrode 201 may be incidentally etched during the formation of the MTJ device 210 and/or during the cleanup process. In some embodiments, between 0.5 nm and 1 nm of exposed portions of the SOT electrode 201 may be etched forming a step height feature.

Figure 7B:
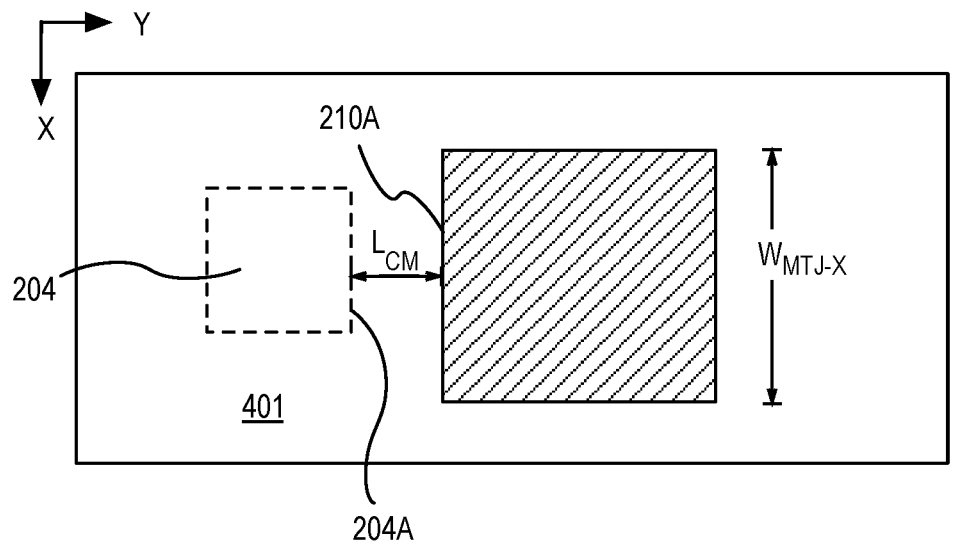
FIG. 7B illustrates a plan view of the structure in FIG. 7A.

FIG. 7B illustrates a plan view of the structure in FIG. 7A. The illustrative embodiment, provides an example of the square shape of the MTJ device 210 and a spatial separation, $L_{CM}$, between the sidewall 204A of conductive interconnect 204 and the sidewall 210A after the etching the MTJ material layer stack 450 to form the MTJ device 210. The MTJ device 210 has a width $W_{MTJ-X}$ (along the X-direction).

Figure 8A:
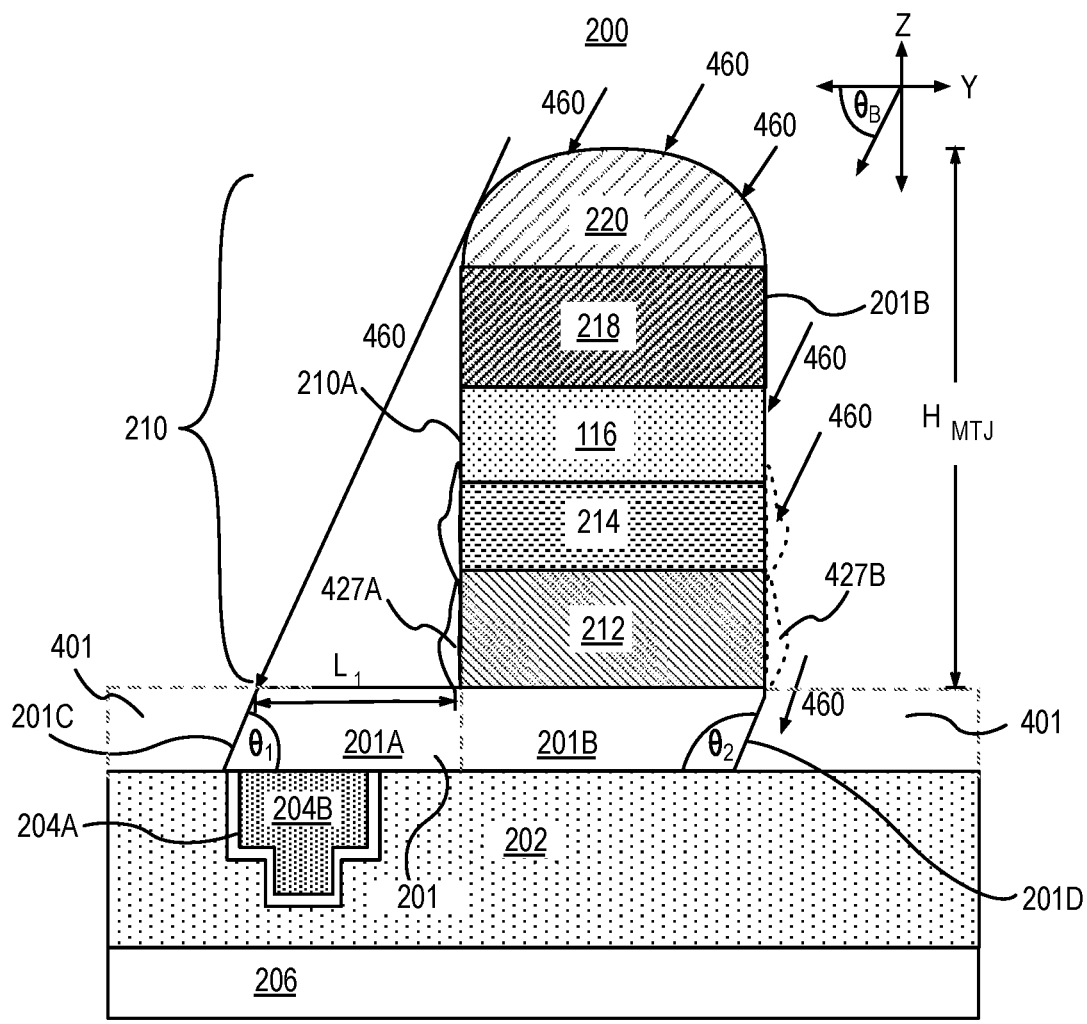
FIG. 8A illustrates a cross-sectional view of the structure in FIG. 7A following patterning of the SOT layer to form a SOT electrode.

FIG. 8A illustrates a cross-sectional view of the structure in FIG. 7A following patterning of the SOT layer 401 to form a SOT electrode 201. In an embodiment, the patterning of the SOT layer includes performing an asymmetrical etch of the first electrode layer with an angled ion beam etching process, where etchant species flux is both directly masked and indirectly shadowed by the MTJ device 210. In the illustrative embodiment, the etching forms a SOT electrode portion 201A external the sidewall 210A of the MTJ device 210 and a SOT electrode portion 201B, internal of sidewall 210 and under the MTJ device 210. The ion beam may include neutral atoms of elements such as Argon, Krypton or Xenon.

In the illustrative embodiment, ion beam etching process comprises directing an ion beam 460 toward the SOT layer 401 and the MTJ device 210 at an angle, $\theta_B$, relative to a horizontal plane that is parallel to a plane of the SOT layer 401. The ion beam 460 may be directed at a range of angles, $\theta_B$, for example between 45 degrees and 80 degrees. As the ion beam etching process is carried out, some portions of the SOT layer 401 are etched, while other portions are masked and/or shadowed by the MTJ device 210. Specifically, for a range of angles, $\theta_B$, between 45 degrees and 80 degrees, there are two portions of the SOT layer 401 that are masked and/or shadowed by the MTJ device 210. A first portion, SOT electrode portion 201B, is directly under the MTJ device 210. A second portion, STO electrode portion 201A, where the MTJ device 210 casts a shadow on the SOT layer 401. In the illustrative embodiment, the SOT electrode portion 201A is formed to have a length, $L_1$, that is determined by the height, $H_{MTJ}$, of the MTJ device 210 and the incident angle of the ion beam 460. It is to be appreciated that as the ion beam etch angle $\theta_B$, increases in magnitude, the length, $L_1$, decreases. Furthermore, $L_1$, increases with an increase in the MTJ device 210 height, $H_M$.

In some embodiments, the ion beam may be directed at angle, $\theta_B$, that is less than 45 degrees. Etching at such an angle will result in the length $L_1$ to be greater than the height, $H_{MTJ}$, of the MTJ device 210. Such an etch may be desirable when the height of the MTJ device is substantially close to 20 nm in some embodiments.

In the illustrative embodiment, the sidewalls 201C and 201D are formed having slopes defined by angles, $\theta_1$ and $\theta_2$, respectively. In some embodiments, sidewalls 201C and 201D are formed having slopes defined by angles, $\theta_1$ and $\theta_2$, respectively, where the angles $\theta_1$ and $\theta_2$ are substantially close to an ion beam etching angle $\theta_B$.

It is to be appreciated that while the ion beam 460 is incident on sidewall 210B, sidewall 210A receives no ion beam 460 flux. Unequal flux of ion beam 460 may also cause asymmetry in the profile of the MTJ device 210. In examples where residue 427A, 427B are left on the sidewalls of the MTJ device 210, (e.g., even after the cleanup process described above) the ion beam etching process may selectively remove some or all residue 427 (dashed lines) from sidewall 210B while, leaving more residue 427A on sidewall 210A.

Figure 8B:
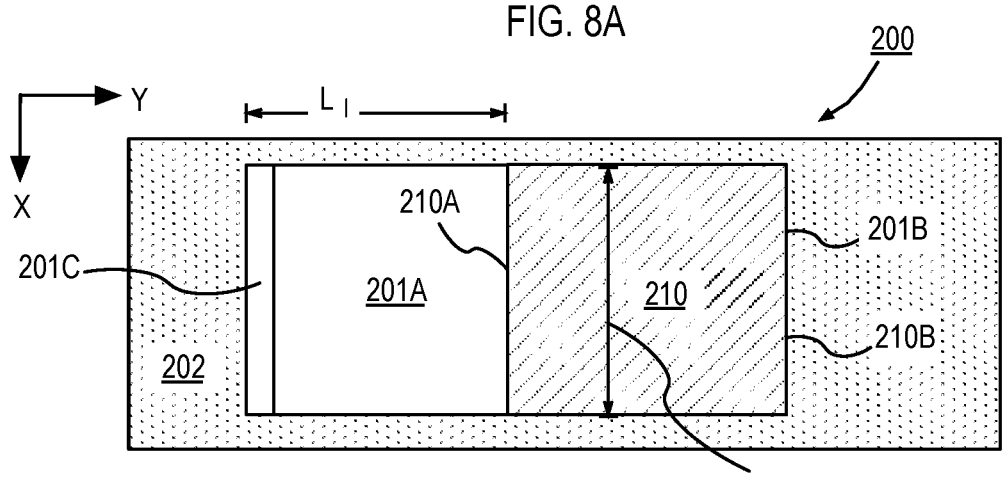
FIG. 8B illustrates a plan view of the structure in FIG. 8A.

Upon completion of the ion beam etching process, the dielectric layer 202 is exposed and surrounds the SOT memory device 200 as illustrated in the plan view illustration of FIG. 8B. The plan view illustration also demonstrates a self-aligned patterning process where the shape of the sidewall 201C (from a plan view perspective) has portions that resemble a shape of the sidewall 210A due to the nature of the ion beam etching process. In the illustrative embodiment, the sidewall 201A has a straight profile resembles the straight profile of the sidewall 201C. It is to be appreciated that the sidewall 201C may have edges that are ridged.

In embodiments, where the MTJ device 210 has a circular plan view profile, such as is described above in association with FIG. 2C, the ion beam etching process forms a sidewall 201C having a curved profile (from a plan view perspective) which resembles the circular plan view profile of the MTJ device 210. The degree of resemblance between the plan view shape of an uppermost surface of the MTJ device 210 and sidewall 201C of the SOT electrode portion 201A (from a plan-view perspective) also depends on the ion beam etch angle, $\theta_B$. For example, a decrease in magnitude of ion beam etch angle, $\theta_B$, may distort the shape of the sidewall 201C.

Figure 9A:
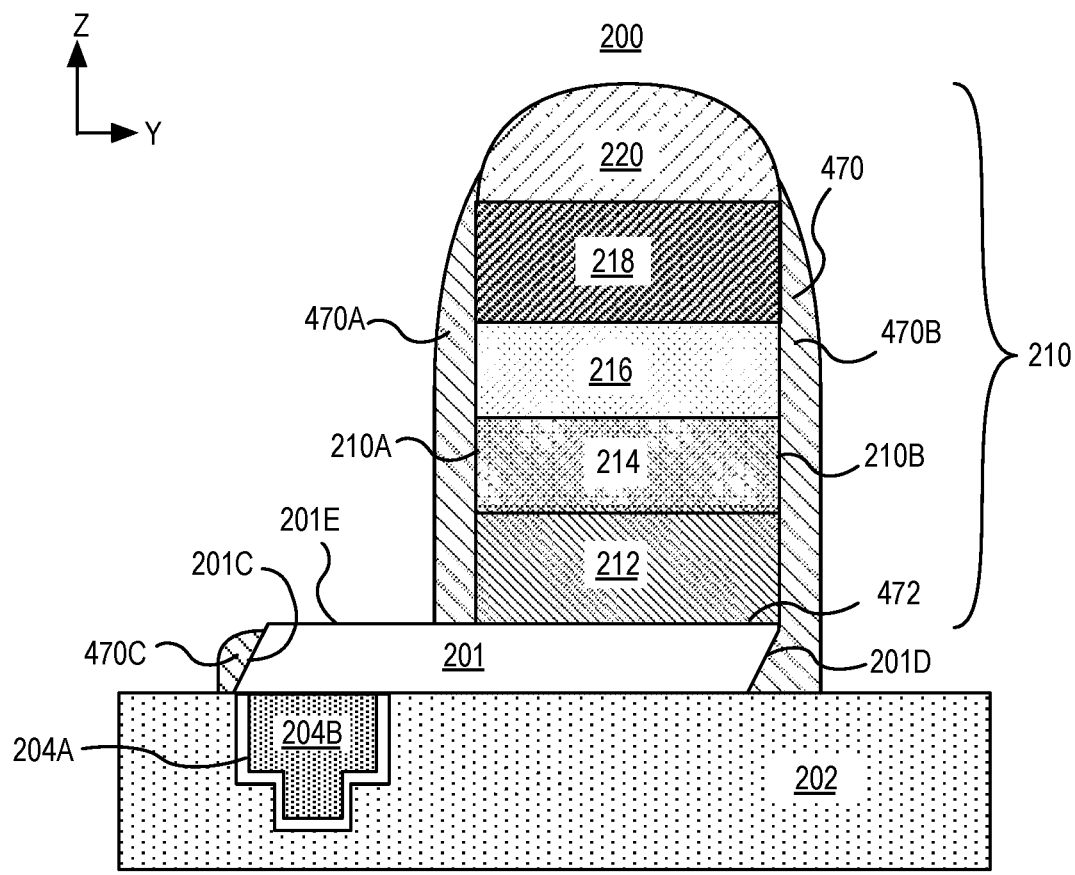
FIG. 9A illustrates a cross-sectional view of the structure in FIG. 8A following the formation of a dielectric spacer adjacent to the MTJ device.

FIG. 9A illustrates a cross-sectional view of the structure in FIG. 8A following the formation of a dielectric spacer 470 adjacent to the MTJ device 210. In an embodiment, a dielectric spacer layer is deposited on the MTJ device 210 and on the uppermost surface of the SOT electrode 201 and on the dielectric layer 202. In an embodiment, the dielectric spacer layer is blanket deposited without a vacuum break following the ion beam etching process. The dielectric spacer layer may also be deposited using a PVD or a PECVD deposition process. In some embodiments, the dielectric spacer layer includes a material such as, but not limited to, silicon nitride (e.g., comprising predominantly silicon and nitrogen), carbon doped silicon nitride (e.g., comprising predominantly silicon and nitrogen and a minor faction of carbon), or silicon carbide (e.g., comprising predominantly silicon and carbon). The dielectric spacer layer may include an insulator layer that does not have an oxygen content to minimize potential oxidation of magnetic layers. After deposition, the dielectric spacer layer may be etched by a plasma etch process to form a dielectric spacer 470 on sidewalls of the MTJ device 210, and on sidewalls of the SOT electrode 201. In the illustrative embodiment, the dielectric spacer 470 has a dielectric spacer portion 470A adjacent to sidewall 210A, a dielectric spacer portion 470B that is adjacent to sidewalls 210B and 201D, and a dielectric spacer portion 470C that is adjacent to sidewall 201C. The dielectric spacer 470 also peripherally covers an interface between the SOT electrode 201 and the free magnet 212.

Figure 9B:
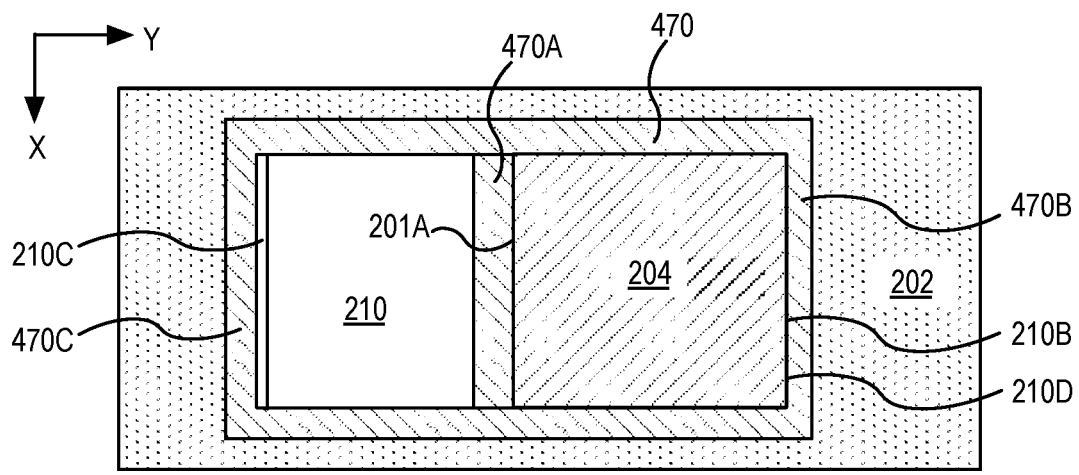
FIG. 9B illustrates a plan view of the structure in FIG. 9A.

FIG. 9B illustrates a plan view of the structure in FIG. 9A. In the illustrative embodiment, the dielectric spacer 470 is shown surrounding sidewalls of the SOT electrode 201 and sidewalls of the MTJ device 210.

Referring again to FIG. 9A, in some embodiments, the dielectric spacer etch process is extended after exposing the dielectric layer 202 and uppermost surface 201F. In some such embodiments, portions of the dielectric spacer 470 may become diminished and be eroded completely off portions of sidewalls of the SOT electrode 201. For example, dielectric spacer portion 470C may be removed from sidewall 201C by an extended dielectric spacer etch. However, it is to be appreciated that after an extended dielectric spacer etch, the resulting dielectric spacer 470 peripherally covers an interface 472 between the SOT electrode 201 and the free magnet 212.

Figure 9C:
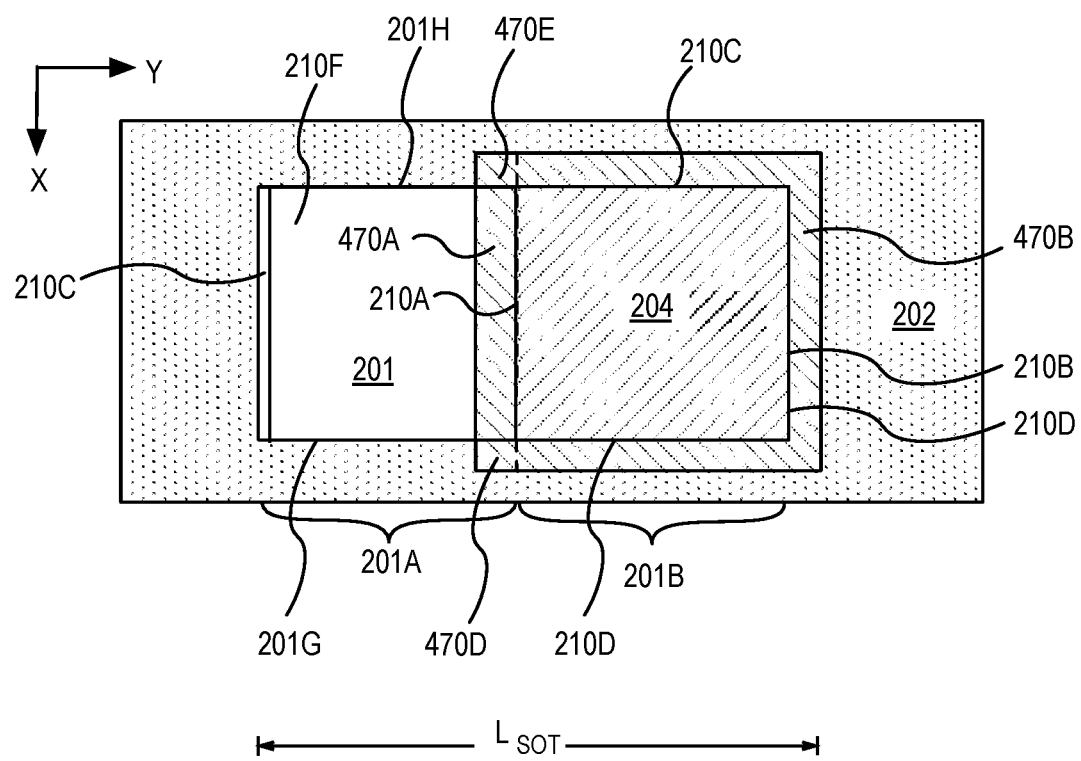
FIG. 9C illustrates a plan view of the structure in FIG. 9A following an extended spacer etch.

FIG. 9C illustrates a plan view of the structure in FIG. 9A following an extended spacer etch. In one such embodiment, the dielectric spacer portion 470B is on sidewall 210A, 210B, 210C and 210D of the MTJ device 210 and on sidewall 201D of the SOT electrode portion 201B. In a further such embodiment, a dielectric spacer portion 470D remains on a portion of sidewall 201G of SOT electrode portion 201A, along the length, $L_{SOT}$, of the SOT electrode 201, and a dielectric spacer portion 470E remains on a portion of sidewall 201H of the SOT electrode portion 201A.

Figure 10:
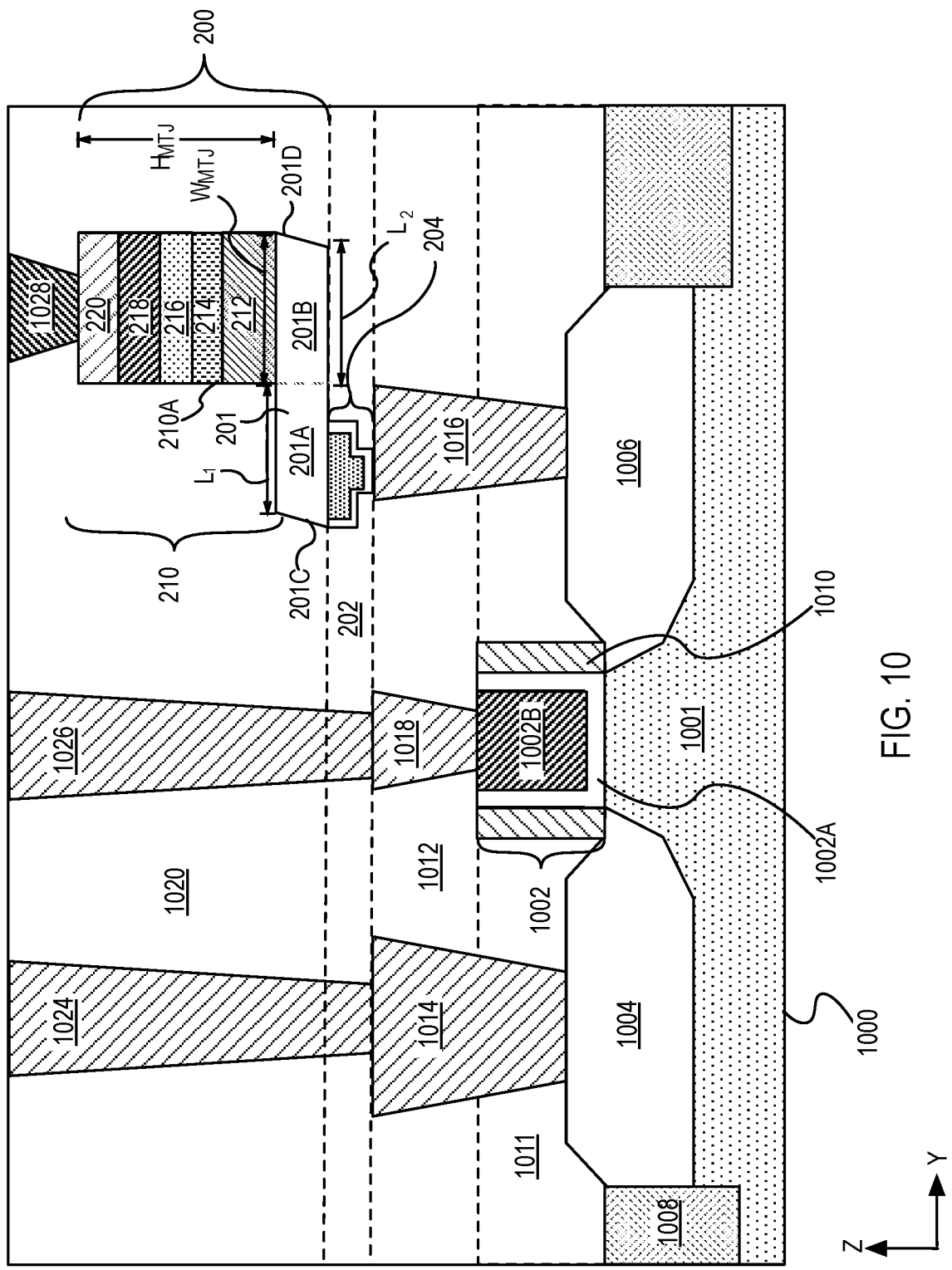
FIG. 10 illustrates a cross-sectional view of a SOT memory device coupled to a drain contact of a transistor.

FIG. 10 illustrates a SOT device coupled to an access transistor 1000. In an embodiment, the SOT memory device 200 includes a MTJ device 210 on a SOT electrode 201, described in association with FIG. 2A. The SOT memory device 200 may include one or more features of the SOT memory device 200 described above in association with FIGS. 2A-2F. In the illustrative embodiment, the MTJ device 210 is coupled to the transistor through a conductive interconnect 204 and a drain contact 1016. The drain contact 1016 is coupled with the drain region 1006 of the access transistor 1000. The SOT memory device 200 includes a SOT electrode 201. The SOT memory device 200 further includes a magnetic tunnel junction (MTJ) device 210 on the electrode 201, where the MTJ device 210 has a height, $H_{MTJ}$, and a width, $W_{MTJ}$. In the illustrative embodiment, a first portion 201A of the SOT electrode 201 extends beyond a sidewall 210A of the MTJ device 210 by a first length, $L_1$. In exemplary embodiments, the SOT electrode portion 201A extends beyond the sidewall 210A of the MTJ device 210 by a first length, $L_1$, that is no greater than the height, $H_{MTJ}$, of the MTJ device 210. A second portion 201B of the SOT electrode 201 extends from the sidewall 210A and under the MTJ by a second length, $L_2$, that is no greater than the width, $W_{MTJ}$, of the MTJ device 210. The MTJ device 210 includes a free magnet 212 coupled with the SOT electrode 201, a fixed magnet 216; a tunnel barrier 214 between the free magnet 212 and the fixed magnet 216, a SAF structure 218 on the fixed magnet 216 and an electrode 220 coupled with the SAF structure 218.

In an embodiment, the underlying substrate 1001 represents a surface used to manufacture integrated circuits. Suitable substrate 1001 includes a material such as single crystal silicon, polycrystalline silicon and silicon on insulator (SOI), as well as substrates formed of other semiconductor materials. The substrate 1001 may also include semiconductor materials, metals, dielectrics, dopants, and other materials commonly found in semiconductor substrates.

In an embodiment, the access transistor 1000 associated with substrate 1001 are metal-oxide-semiconductor field-effect transistors (MOSFET or simply MOS transistors), fabricated on the substrate 1001. In various implementations of the invention, the access transistor 1000 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, the access transistor 1000 of substrate 1001 includes a gate 1002 including at least two layers, a gate dielectric layer 1002A and a gate electrode 1002B. The gate dielectric layer 1002A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 1002A to improve its quality when a high-k material is used.

The gate electrode 1002B of the access transistor 1000 of substrate 1001 is formed on the gate dielectric layer 1002A and may consist of at least one P-type workfunction metal or N-type workfunction metal, depending on whether the transistor is to be a PMOS or an NMOS transistor. In some implementations, the gate electrode 1002B may consist of a stack of two or more metal layers, where one or more metal layers are workfunction metal layers and at least one metal layer is a conductive fill layer.

For a PMOS transistor, metals that may be used for the gate electrode 1002B include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 1002B may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode 1002B may consist of one or more U-shaped metal layers formed atop one or more planar, non-U-shaped layers.

In some implementations of the invention, a pair of sidewall spacers 1010 may be formed on opposing sides of the gate stack that bracket the gate stack. The sidewall spacers 1010 may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack. As is well known in the art, source region 1004 and drain region 1006 are formed within the substrate adjacent to the gate stack of each MOS transistor. The source region 1004 and drain region 1006 are generally formed using either an implantation/diffusion process or an etching/deposition process. In the former process, dopants such as boron, aluminum, antimony, phosphorous, or arsenic may be ion-implanted into the substrate to form the source region 1004 and drain region 1006. An annealing process that activates the dopants and causes them to diffuse further into the substrate typically follows the ion implantation process. In the latter process, the substrate 1001 may first be etched to form recesses at the locations of the source and drain regions. An epitaxial deposition process may then be carried out to fill the recesses with material that is used to fabricate the source region 1004 and drain region 1006. In some implementations, the source region 1004 and drain region 1006 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 1004 and drain region 1006 may be formed using one or more alternate semiconductor materials such as germanium or a group III-V material or alloy. And in further embodiments, one or more layers of metal and/or metal alloys may be used to form the source region 1004 and drain region 1006. In the illustrative embodiment, an isolation 1008 is adjacent to the source region 1004, drain region 1006 and portions of the substrate 1001.

In an embodiment, a source contact 1014 and a drain contact 1016 are formed in a dielectric layer 1011 and in the dielectric layer 1012 above the gate electrode 1002B. In the illustrative embodiment, a source metallization structure 1024 is coupled with the source contact 1014 and a gate metallization structure 1026 is coupled with the gate contact 1018. In the illustrated embodiment, a dielectric layer is adjacent to the gate contact 1018, drain contact 1016, source contact 1014 and portions of the source metallization structure 1024 and the gate metallization structure 1026.

In an embodiment, the source contact 1014, the drain contact 1016 and gate contact 1018 each include a multi-layer stack. In an embodiment, the multi-layer stack includes two or more distinct layers of metal such as a layer of Ti, Ru or Al and a conductive cap on the layer of metal. The conductive cap may include a material such as W or Cu. Metallization structures 1024 and 1026 and memory contact 1028 may include a structure and materials that are substantially the same as the structure and materials of the conductive interconnect 204. In an embodiment, the conductive interconnect 204 includes a barrier layer 204A, such as tantalum nitride, and a fill metal 204B, such as copper, tungsten or ruthenium. The conductive interconnect 404 may be adjacent to dielectric layer 202 as illustrated.

In some embodiments, a dielectric spacer may be adjacent to the MTJ device 210 and SOT electrode 201 (not shown). The dielectric layer 1020 is adjacent to portions of the source metallization structure 1024, the gate metallization structure 1026 and the memory contact 1028.

The isolation 1008, dielectric layer 1012, 1011, 202 and 1020 may include any material that has sufficient dielectric strength to provide electrical isolation such as, but not, limited silicon dioxide, silicon nitride, silicon oxynitride, carbon doped nitride and carbon doped oxide.

Figure 11:
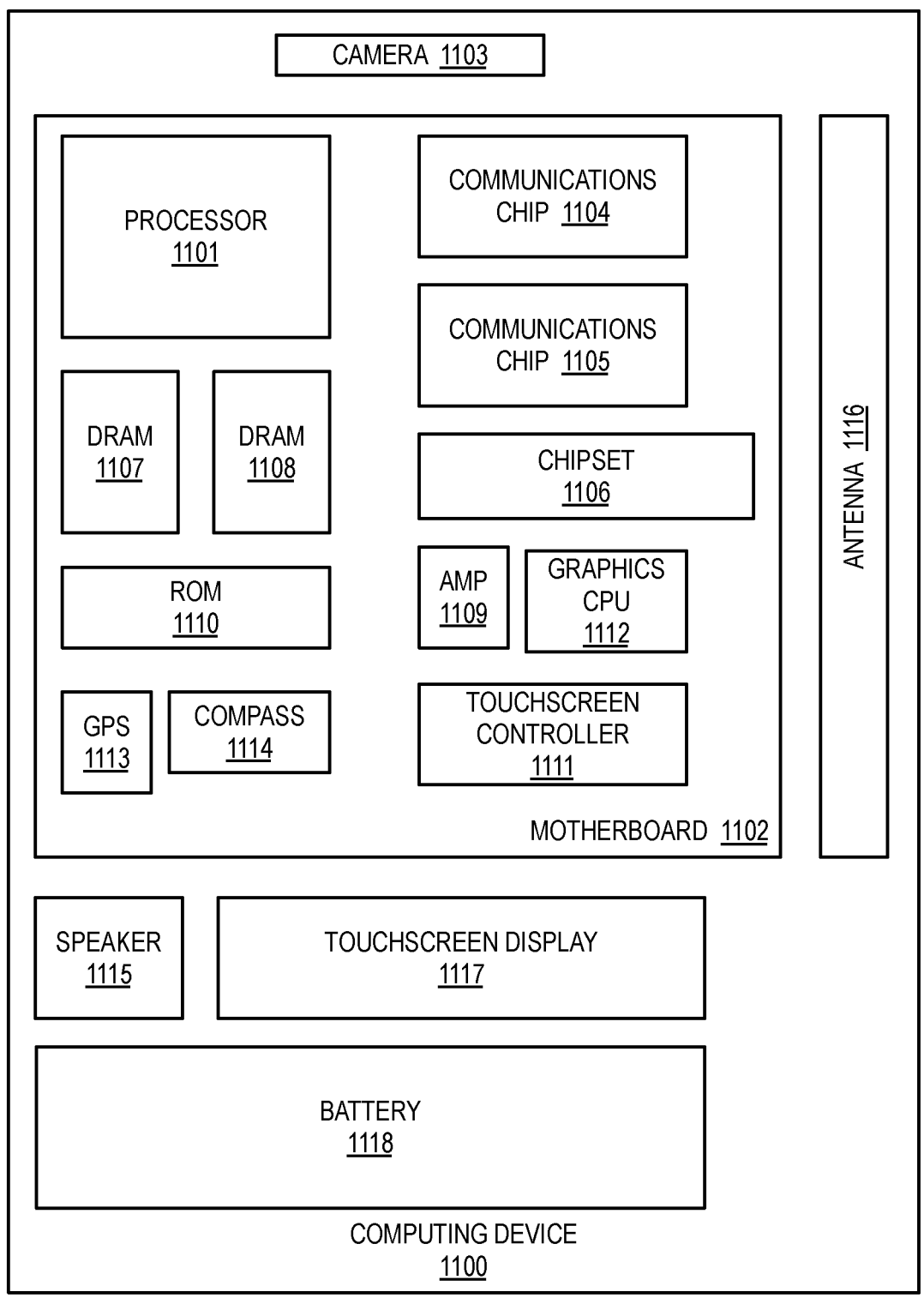
FIG. 11 illustrates a computing device in accordance with embodiments of the present disclosure.

FIG. 11 illustrates a computing device 1100 in accordance with embodiments of the present disclosure. As shown, computing device 1100 houses a motherboard 1102. Motherboard 1102 may include a number of components, including but not limited to a processor 1101 and at least one communication chip 1105. Processor 1101 is physically and electrically coupled to the motherboard 1102. In some implementations, communication chip 1105 is also physically and electrically coupled to motherboard 1102. In further implementations, communication chip 1105 is part of processor 1101.

Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset 1106, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 1105 enables wireless communications for the transfer of data to and from computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1105 may implement any of a number of wireless standards or protocols, including but not limited to Wi-Fi (IEEE 802.11 family), WiMAX (IEEE 802.11 family), IEEE 802.10, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1100 may include a plurality of communication chips 1104 and 1105. For instance, a first communication chip 1105 may be dedicated to shorter range wireless communications such as Wi-Fi and Bluetooth and a second communication chip 1104 may be dedicated to longer range wireless communications such as GPS, EDGE, GPRS, CDMA, WiMAX, LTE, Ev-DO, and others.

Processor 1101 of the computing device 1100 includes an integrated circuit die packaged within processor 1101. In some embodiments, the integrated circuit die of processor 1101 includes a transistor coupled with one at least one SOT memory device such as a SOT memory device 200 including a MTJ device 210 on a SOT electrode 201. The term "processor" may refer to any device or portion of a device that processes electronic data from registers and/or memory to transform that electronic data into other electronic data that may be stored in registers and/or memory.

Communication chip 1105 also includes an integrated circuit die packaged within communication chip 1106. In another embodiment, the integrated circuit die of communication chips 1104, 1105 include a memory array with memory cells including a SOT memory device 200 including a MTJ device 210 on a SOT electrode 201.

In various examples, one or more communication chips 1104, 1105 may also be physically and/or electrically coupled to the motherboard 1102. In further implementations, communication chips 1104 may be part of processor 1101. Depending on its applications, computing device 1100 may include other components that may or may not be physically and electrically coupled to motherboard 1102. These other components may include, but are not limited to, volatile memory (e.g., DRAM) 1107, 1108, non-volatile memory (e.g., ROM) 1110, a graphics CPU 1112, flash memory, global positioning system (GPS) device 1113, compass 1114, a chipset 1106, an antenna 1116, a power amplifier 1109, a touchscreen controller 1111, a touchscreen display 1117, a speaker 1115, a camera 1103, and a battery 1118, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1100 and discussed above may contain a stand-alone integrated circuit memory die that includes one or more arrays of memory cells including at least one SOT memory device 200, built in accordance with embodiments of the present disclosure.

In various implementations, the computing device 1100 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Figure 12:
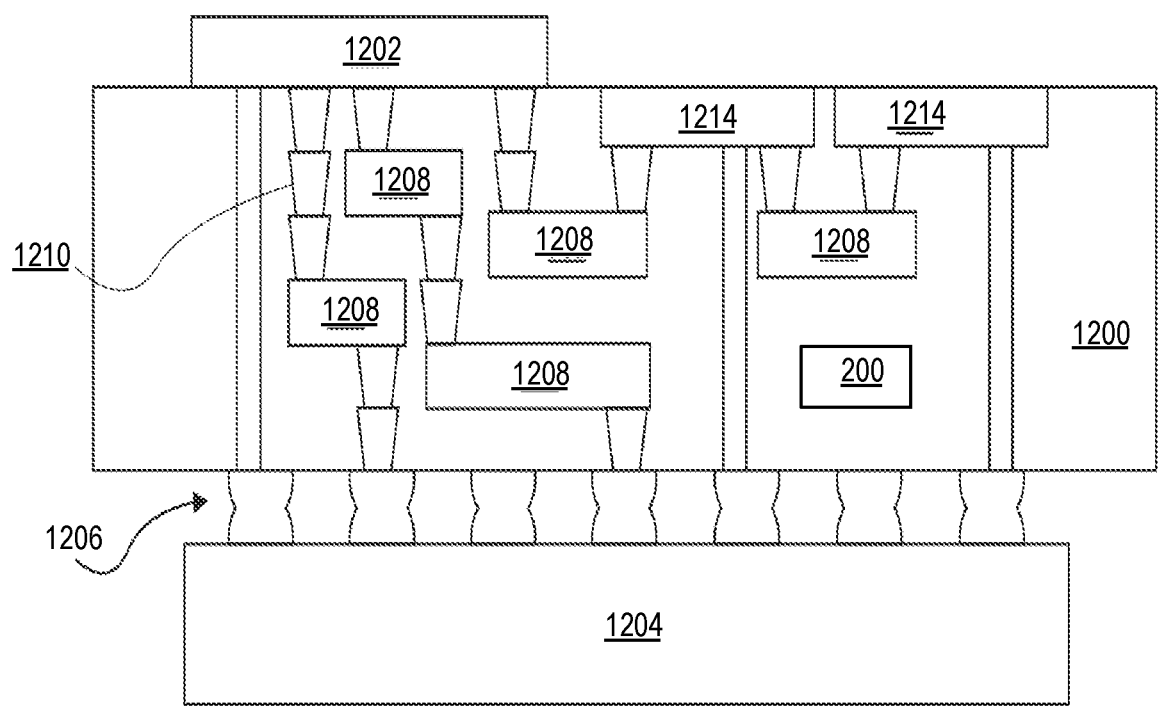
FIG. 12 illustrates an integrated circuit (IC) structure that includes one or more embodiments of the present disclosure.

FIG. 12 illustrates an integrated circuit structure 1200 that includes one or more embodiments of the disclosure. The integrated circuit (IC) structure 1200 is an intervening structure used to bridge a first substrate 1202 to a second substrate 1204. The first substrate 1202 may be, for instance, an integrated circuit die. The second substrate 1204 may be, for instance, a memory module, a computer mother, or another integrated circuit die. The integrated circuit structure 1200 may include one or more device systems such as a device structure including a transistor coupled with at least one SOT memory device such as a SOT memory device 200. Generally, the purpose of an integrated circuit (IC) structure 1200 is to spread a connection to a wider pitch or to reroute a connection to a different connection. For example, an integrated circuit (IC) structure 1200 may couple an integrated circuit die to a ball grid array (BGA) 1206 that can subsequently be coupled to the second substrate 1204. In some embodiments, the first and second substrates 1202/1204 are attached to opposing sides of the integrated circuit (IC) structure 1200. In other embodiments, the first and second substrates 1202/1204 are attached to the same side of the integrated circuit (IC) structure 1200. And in further embodiments, three or more substrates are interconnected by way of the integrated circuit (IC) structure 1200.

The integrated circuit (IC) structure 1200 may be formed of an epoxy resin, a fiberglass-reinforced epoxy resin, a ceramic material, or a polymer material such as polyimide. In further implementations, the integrated circuit (IC) structure 1200 may be formed of alternate rigid or flexible materials that may include the same materials described above for use in a semiconductor substrate, such as silicon, germanium, and other group III-N, group III-V and group IV materials. The integrated circuit (IC) structure 1200 may include metal interconnects 1208 and via 1210, including but not limited to through-silicon vias (TSVs) 1210. The integrated circuit (IC) structure 1200 may further include embedded devices 1214, including both passive and active devices. Such devices include, but are not limited to, capacitors, decoupling capacitors, resistors, inductors, fuses, diodes, transformers, device structure including a transistor coupled with at least one SOT memory device, such as SOT memory device 200, for example, one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 1200. In accordance with embodiments of the present disclosure, apparatuses or processes disclosed herein may be used in the fabrication of integrated circuit (IC) structure 1200.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of SOT memory device 200. Such a SOT memory device 200 may be used in an embedded non-volatile memory application.

Specific embodiments are described herein with respect to a SOT memory device including a MTJ device. It is to be appreciated that embodiments described herein may also be applicable to in-plane MTJ devices including in-plane spin torque transfer memory (STTM) devices and perpendicular MTJ devices including spin torque transfer memory (STTM) devices.

Thus, embodiments of the present disclosure include self-aligned SOT memory device and methods of fabrication.

What is claimed is:

1. A two terminal spin orbit torque (SOT) device, wherein:
   one of the two terminals is a first electrode comprising a spin orbit torque material, the first electrode with a first end over, and coupled to, a conductive interconnect, and the first electrode extending laterally to a second end, distal from the conductive interconnect;
   a magnetic tunnel junction (MTJ), wherein the MTJ comprises:
      a free magnet, over, and coupled with, the first electrode;
      a fixed magnet; and
      a tunnel barrier between the free magnet and the fixed magnet, wherein the MTJ is laterally offset from the conductive interconnect toward the second end of the first electrode, and the MTJ has a height over the first electrode, and wherein the first electrode extends laterally toward the first end beyond a sidewall of the MTJ by a non-zero length that is no greater than the height of the MTJ; and
   another of the two terminals is a second electrode coupled with the fixed magnet.

2. The SOT device of claim 1, wherein the first end of the first electrode comprises a sidewall having a first slope relative to a lowermost surface of the first electrode, wherein the second end of the first electrode comprises a sidewall having a second slope relative to the lowermost surface of the first electrode, wherein the first slope and the second slope are different from a third slope of the sidewall of the MTJ relative to the lowermost surface of the first electrode.

3. The SOT device of claim 2, wherein the first slope is between 45 degrees and 80 degrees.

4. The SOT device of claim 2, wherein the second slope is between 100 degrees and 135 degrees.

5. The SOT device of claim 2, where the first slope is between 45 degrees and 80 degrees and the second slope is between 100 degrees and 135 degrees.

6. The SOT device of claim 2, wherein the sidewall of the first end of the first electrode and the sidewall of the second end of the first electrode are substantially parallel.

7. The SOT device of claim 1, wherein the length is between 15% and 100% of the height of the MTJ.

8. The SOT device of claim 7, wherein the length is substantially equal to the height of the MTJ.

9. The SOT device of claim 1, wherein a width of the MTJ summed with the length is between 100 nm and 200 nm, and the first electrode has a thickness between 5 nm and 20 nm.

10. The SOT device of claim 1, wherein the height of the MTJ is between 20 nm and 100 nm.

11. The SOT device of claim 1, wherein the conductive interconnect has a nearest sidewall that is laterally spaced apart from the sidewall of the MTJ by an amount less than the length.

12. The SOT device of claim 11, wherein the conductive interconnect is in contact with the second end of the first electrode.

13. An apparatus comprising:
    a transistor above a substrate, the transistor comprising:
       a drain contact coupled to a drain;
       a source contact coupled to a source;
       a gate contact coupled to a gate; and
    the two terminal SOT device of claim 1 coupled with the drain contact.

14. A method of fabricating a two terminal spin orbit torque (SOT) device, the method comprising:
    depositing a first electrode layer over a conductive interconnect, the first electrode layer comprising a spin orbit torque material;
    forming a material layer stack for a magnetic tunnel junction (MTJ) memory device over the first electrode layer by:
       depositing a free ferromagnetic layer;
       depositing a tunnel barrier layer over the free ferromagnetic layer;
       depositing a fixed magnetic layer over the tunnel barrier layer; and
       depositing a second electrode layer over the fixed magnetic layer;
    forming a first of the two terminals from the second electrode layer by etching the material layer stack into a magnetic tunnel junction (MTJ) device laterally offset from the conductive interconnect; and
    forming a second of the two terminals that extends a non-zero length laterally from a sidewall of the MTJ device to the conductive interconnect by patterning the first electrode layer with an angled etching process that is masked by a height of the MTJ device.

15. The method of claim 14, wherein the ion beam angled etching process comprises directing an ion beam toward the first electrode layer and the MTJ device, at angle less than 90 degrees relative to a plane of the first electrode layer.

16. The method of claim 15, wherein the angle is between 45 and 80 degrees.

17. The method of claim 14, wherein etching the material layer stack a into the MTJ device comprises an etch process having different anisotropy than the angled etching process that is terminated before the spin obit torque material is completely removed.

18. The method of claim 14, wherein etching the material layer stack into the MTJ device comprises forming an etch residue on the sidewall of the MTJ device.

19. The method of claim 18, wherein the angled etching process comprises removing an exposed portion of the etch residue and leaving a portion of the etch residue on the sidewall of the MTJ device protected from the angled etching process.

* * * * *